US009741815B2

(12) United States Patent
Xie et al.

(10) Patent No.: US 9,741,815 B2
(45) Date of Patent: Aug. 22, 2017

(54) METAL SELENIDE AND METAL TELLURIDE THIN FILMS FOR SEMICONDUCTOR DEVICE APPLICATIONS

(71) Applicant: ASM IP Holding B.V., Almere (NL)

(72) Inventors: Qi Xie, Leuven (BE); Fu Tang, Gilbert, AZ (US); Michael Eugene Givens, Phoenix, AZ (US); Jan Willem Maes, Wilrijk (BE)

(73) Assignee: ASM IP HOLDING B.V., Almere (NL)

( * ) Notice: Subject to any disclaimer, the term of this patent is extended or adjusted under 35 U.S.C. 154(b) by 0 days.

(21) Appl. No.: 14/741,246

(22) Filed: Jun. 16, 2015

(65) Prior Publication Data

US 2016/0372543 A1    Dec. 22, 2016

(51) Int. Cl.
 *H01L 29/51* (2006.01)
 *H01L 21/28* (2006.01)
 *H01L 29/66* (2006.01)

(52) U.S. Cl.
 CPC ...... *H01L 29/517* (2013.01); *H01L 21/28255* (2013.01); *H01L 21/28264* (2013.01); *H01L 29/66568* (2013.01); *H01L 29/513* (2013.01)

(58) Field of Classification Search
 None
 See application file for complete search history.

(56) References Cited

U.S. PATENT DOCUMENTS

| 4,354,198 A | 10/1982 | Hodgson et al. |
| 4,751,200 A | 6/1988 | Gmitter et al. |
| 5,124,278 A | 6/1992 | Bohling et al. |

(Continued)

FOREIGN PATENT DOCUMENTS

| EP | 0 265 314 A1 | 4/1988 |
| EP | 2 068 368 A2 | 6/2009 |

(Continued)

OTHER PUBLICATIONS

Alian, et al., "Ammonium sulfide vapor passivation of / $In_{0.53}Ga_{0.47}As$ and InP surfaces," Applied Physics Letters, vol. 99, Issue 11, pp. 112114-112114-3, Sep. 2011.

(Continued)

*Primary Examiner* — Reema Patel
*Assistant Examiner* — Steven Christopher
(74) *Attorney, Agent, or Firm* — Knobbe, Martens, Olson & Bear LLP

(57) ABSTRACT

In some aspects, methods of forming a metal selenide or metal telluride thin film are provided. According to some methods, a metal selenide or metal telluride thin film is deposited on a substrate in a reaction space in a cyclical deposition process where at least one cycle includes alternately and sequentially contacting the substrate with a first vapor-phase metal reactant and a second vapor-phase selenium or tellurium reactant. In some aspects, methods of forming three-dimensional architectures on a substrate surface are provided. In some embodiments, the method includes forming a metal selenide or metal telluride interface layer between a substrate and a dielectric. In some embodiments, the method includes forming a metal selenide or metal telluride dielectric layer between a substrate and a conductive layer.

23 Claims, 6 Drawing Sheets

(56) References Cited

U.S. PATENT DOCUMENTS

| | | | |
|---|---|---|---|
| 5,168,077 A | 12/1992 | Ashizawa et al. | |
| 5,294,818 A * | 3/1994 | Fujita | H01L 29/78 257/192 |
| 5,393,680 A | 2/1995 | Shikata | |
| 5,451,542 A | 9/1995 | Ashby | |
| 5,616,947 A * | 4/1997 | Tamura | H01L 21/28264 257/289 |
| 5,646,419 A | 7/1997 | McCaldin et al. | |
| 5,760,462 A | 6/1998 | Barron et al. | |
| 6,071,780 A | 6/2000 | Okamoto et al. | |
| 6,112,013 A | 8/2000 | Hsiao et al. | |
| 6,117,720 A | 9/2000 | Harshfield | |
| 6,150,253 A | 11/2000 | Doan et al. | |
| 6,207,976 B1 | 3/2001 | Takahashi et al. | |
| 6,248,605 B1 | 6/2001 | Harkonen et al. | |
| 6,380,097 B1 | 4/2002 | Dauplaise et al. | |
| 6,445,015 B1 | 9/2002 | Braddock | |
| 6,534,368 B2 | 3/2003 | Zahorik | |
| 6,635,951 B1 | 10/2003 | Zahorik | |
| 6,670,651 B1 | 12/2003 | Braddock | |
| 6,709,958 B2 | 3/2004 | Li et al. | |
| 6,710,423 B2 | 3/2004 | Moore et al. | |
| 6,727,192 B2 | 4/2004 | Moore et al. | |
| 6,730,547 B2 | 5/2004 | Li et al. | |
| 6,734,455 B2 | 5/2004 | Li | |
| 6,791,125 B2 | 9/2004 | Demkov et al. | |
| 6,812,087 B2 | 11/2004 | Giltom et al. | |
| 7,094,651 B2 | 8/2006 | Mitzi et al. | |
| 7,094,700 B2 | 8/2006 | Li et al. | |
| 7,307,277 B2 | 12/2007 | Frey et al. | |
| 7,341,960 B2 | 3/2008 | Lee et al. | |
| 7,394,088 B2 | 7/2008 | Lung | |
| 7,619,248 B1 | 11/2009 | Cleeves | |
| 7,678,708 B2 | 3/2010 | Vaartstra et al. | |
| 7,855,105 B1 * | 12/2010 | Jagannathan | H01L 21/823431 257/E21.629 |
| 7,964,490 B2 | 6/2011 | Clendenning et al. | |
| 7,972,898 B2 | 7/2011 | Cowdery-Corvan et al. | |
| 8,368,135 B2 | 2/2013 | Chau et al. | |
| 8,766,330 B2 | 7/2014 | Paranjape et al. | |
| 8,796,125 B2 | 8/2014 | Rockenberger et al. | |
| 9,245,742 B2 | 1/2016 | Haukka et al. | |
| 9,461,134 B1 | 10/2016 | Xie et al. | |
| 9,478,419 B2 | 10/2016 | Haukka et al. | |
| 2002/0041931 A1 | 4/2002 | Suntola et al. | |
| 2002/0106849 A1 | 8/2002 | Moore | |
| 2005/0257824 A1 | 11/2005 | Maltby et al. | |
| 2007/0023745 A1 * | 2/2007 | Jung | H01L 29/1054 257/19 |
| 2007/0111429 A1 | 5/2007 | Lung | |
| 2008/0006930 A1 | 1/2008 | Ichida | |
| 2008/0083924 A1 | 4/2008 | Song et al. | |
| 2008/0242012 A1 * | 10/2008 | Pae | H01L 21/28079 438/197 |
| 2008/0272355 A1 | 11/2008 | Cho et al. | |
| 2009/0179254 A1 | 7/2009 | Van Schaijk et al. | |
| 2010/0059820 A1 | 3/2010 | Ohmi et al. | |
| 2010/0072451 A1 | 3/2010 | Terao et al. | |
| 2010/0159135 A1 | 6/2010 | Bent et al. | |
| 2010/0203672 A1 | 8/2010 | Eun et al. | |
| 2010/0291299 A1 | 11/2010 | Cameron et al. | |
| 2010/0300524 A1 | 12/2010 | Martinson et al. | |
| 2011/0006354 A1 | 1/2011 | Jangjian et al. | |
| 2011/0124141 A1 | 5/2011 | Goeoetz et al. | |
| 2011/0147795 A1 | 6/2011 | Rachmady et al. | |
| 2011/0156174 A1 | 6/2011 | Dewey et al. | |
| 2013/0157405 A1 | 6/2013 | Cao et al. | |
| 2013/0270505 A1 | 10/2013 | Dahmani | |
| 2014/0027884 A1 | 1/2014 | Tang et al. | |
| 2014/0120738 A1 | 5/2014 | Jung et al. | |
| 2015/0048296 A1 * | 2/2015 | Park | H01L 27/228 257/2 |
| 2015/0170907 A1 * | 6/2015 | Haukka | H01L 21/02175 438/779 |
| 2015/0200308 A1 | 7/2015 | Karda et al. | |
| 2015/0340228 A1 | 11/2015 | Tapily et al. | |
| 2016/0203974 A1 | 7/2016 | Haukka et al. | |
| 2016/0372365 A1 | 12/2016 | Tang et al. | |

FOREIGN PATENT DOCUMENTS

| | | |
|---|---|---|
| JP | 3-278584 | 12/1991 |
| KR | 10-2004-0038514 | 5/2004 |
| WO | WO 97/48499 | 12/1997 |
| WO | WO 02/15285 A1 | 2/2002 |
| WO | WO 03/019691 A2 | 3/2003 |
| WO | WO 2004/032242 A1 | 4/2004 |

OTHER PUBLICATIONS

Alian, et al., "Oxide trapping in InGaAs—$Al_2O_3$ system and the role of sulfur in reducing the $Al_2O_3$ trap density," Electron Device Letters, vol. 33, Issue 11, pp. 1544-1546, Sep. 21, 2012.

Brennan, B.Sc., "Surface and interface characterization of high-k dielectric materials on silicon and III-V semiconductor substrates," Dublin City University, School of Physical Sciences, Dec. 2009.

Genevee, et al. "Atomic layer deposition of zinc indium sulfide films: Mechanistic studies and evidence of surface exchange reactions and diffusion processes," Journal of Vacuum Science & Technology A., vol. 31, Issue 1, Jan./Feb. 2013.

Hsueh, C., "Alternative Materials for Next-Generation Transistors: High-k/Ge based MOSFET", A dissertation submitted to the Graduate School-New Brunswick Rutgers, 2008, 139 pages.

Ihanus, et al., "Atomic Layer Deposition of SrS and BaS Thin Films Using Cyclopentadienyl Precursors," Chemistry of Materials, vol. 14, Issue 5, pp. 1937-1944, May 2002.

Kukli, et al., "Controlled Growth of Yttrium Oxysulphide Thin Films by Atomic Layer Deposition," Materials Science Forum, vol. 315-317, pp. 216-221, dated 1999.

Leskela et al., "Atomic layer deposition (ALD): from precursors to thin film structures", Thin Solid Firms, vol. 409, (2002), pp. 138-146.

Lin, J., "Low Resistance Contacts to N-Type Germanium", A dissertation submitted to the Department of Electrical Engineering, Jun. 2013, 136 pages.

Misra, "High k dielectrics on High-Mobility Substrates: The Interface!" The Electrochemical Society, pp. 47-51, Winter 2011.

O'Connor, et al., "A systematic study of $(NH_4)_2S$ passivation (22%, 10%, 5%, or 1%) on the interface properties of $Al_2O_3$/ $In_{0.53}Ga_{0.47}As$/ InP system for n-type and p-type $In_{0.53}Ga_{0.47}As$ epitaxial layers," Journal of Applied Physics, vol. 109, Issue 2, pp. 024101-024101-10, dated 2011.

O'Connor, et. al., "Analysis of the minority carrier response of n-type and p-type Au/ Ni/ Al2O3/In0.53Ga0.47/InP capacitors following an optimized (NH4)2S treatment," Applied Physicas Letters, vol. 99, Issue 21, pp. 212901-212901-3, dated 2011.

International Search Report and Written Opinion for International Application No. PCT/US2014/066310, Notification dated Sep. 2, 2015.

International Search Reporting for International Application No. PCT/US2014/066316, Notification dated Mar. 3, 2015.

* cited by examiner

METAL SELENIDE AND METAL TELLURIDE THIN FILMS FOR SEMICONDUCTOR DEVICE APPLICATIONS

BACKGROUND OF THE INVENTION

Field of the Invention

The application relates generally to the field of semiconductor device manufacturing and, more particularly, to metal selenide and telluride thin films and methods for forming the same, such as by atomic layer deposition ("ALD") processes. For example, metal selenide or telluride thin films may be formed by ALD processes and may serve as an interface layer between a substrate and a dielectric layer, or may themselves serve as a dielectric.

Description of the Related Art

In an effort to continue to enhance the performance of high-k metal gate technology, the semiconductor industry has shown interest in high-mobility substrate materials, such as germanium, which exhibits desirable hole mobility, and group III-V materials, which exhibit desirable electron mobility. Suitable group III-V materials include, for example, GaAs, InP, InGaAs, InAs, and GaSb. However, problems with these new channel materials can be present at the interface between the high-mobility material and the overlying dielectric layer.

The high-mobility semiconducting channel, based on materials such as Ge and InGaAs, has a very high number of interface states. These states tend to pin the Fermi energy and can severely deteriorate the function of electronic devices. Selenium or tellurium passivation can be an efficient approach to minimize the interface states. Beyond passivating the surface, an interface layer is desirable for integration with a high-k dielectric layer. However, known interface layers have a variety of problems, such as not preventing oxidation of the underlying high-mobility channel and allowing for undesirable current leakage or charge trapping and not preventing up diffusion of group III-V elements or Ge into the gate dielectric.

SUMMARY OF THE INVENTION

In some aspects, methods of forming metal selenide or telluride thin films are provided. According to some methods, a metal selenide or telluride thin film is deposited on a substrate in a reaction space in a cyclical process where at least one cycle includes alternately and sequentially contacting the substrate with a first vapor-phase metal reactant and a second vapor-phase selenium or tellurium reactant. In some embodiments, the metal reactant comprises a metal selected from the group consisting of Mg, Ca, Sr, and Ba.

In some embodiments, methods for forming a metal selenide or telluride thin film include removing excess vapor-phase metal reactant and reaction byproducts from the substrate after contacting the substrate with the first vapor-phase metal reactant. In some embodiments, methods for forming a metal selenide or telluride thin film include removing excess vapor-phase selenium or tellurium reactant and reaction byproducts from the substrate after contacting the substrate with the second vapor-phase selenium or tellurium reactant. In some embodiments, the second reactant contacts the substrate before the vapor-phase metal reactant contacts the substrate in at least one deposition cycle.

According to some embodiments, a metal selenide or telluride film is formed using a metal reactant having at least one cyclopentadienyl (Cp) ligand. In some embodiments, the metal of the metal sulfide thin film is magnesium (Mg). In some embodiments, the metal reactant is $Mg(Cp)_2$ or a derivative thereof. In some embodiments, the metal reactant comprises Cp or a derivative thereof and the metal is Ca, Ba, or Sr. In some embodiments, the metal reactant includes a metal that is not present in the portion of the substrate surface upon which the metal selenide or telluride thin film is being formed.

According to some embodiments, methods for forming a metal selenide or telluride thin film include using $H_2Se$ or $H_2Te$ as a selenium or tellurium precursor or reactant. In some embodiments, the second reactant, or selenium or tellurium precursor, comprises Se or Te atoms, Se-containing or Te-containing plasma, or Se-radicals or Te-radicals. In some embodiments, the resulting metal sulfide thin film comprises MgSe, MgTe, CaSe, CaTe, SrSe, SrTe, BaSe, or BaTe.

In some embodiments, the metal selenide or telluride thin film has a thickness of between about 0.1 nm and about 5 nm.

In some aspects, methods of forming a magneiusm selenide or magnesium telluride thin film are provided. In at least some methods, the magneiusm selenide or telluride thin film is formed on a substrate in a reaction space in one or more deposition cycles, for example two or more deposition cycles. In some embodiments, one, two or more of the deposition cycles include contacting a substrate with a vapor-phase magnesium precursor, removing excess vapor-phase magnesium reactant and reaction by-products, contacting the substrate with a second vapor phase selenium or tellurium precursor, and removing excess second precursor and reaction by-products. According to some embodiments, the second precursor contacts the substrate before the vapor-phase magnesium precursor contacts the substrate.

In some embodiments, a magnesium selenide or telluride thin film comprises at least one metal other than magnesium. In some embodiments a magnesium selenide or telluride film comprises at least one non-metal element other than selenium or tellurium, such as nitrogen or oxygen.

In some aspects, methods of forming a structure on a substrate surface are provided. In some embodiments, the methods comprise providing a substrate comprising a high-mobility channel, forming a metal selenide or telluride thin film over the high-mobility channel, and forming a conductive layer over the metal selenide or telluride thin film. In some embodiments the metal of the metal selenide or telluride thin film comprises at least one of the following: magnesium, calcium, strontium, and barium. In some embodiments the structure comprises a three-dimensional architecture. In some embodiments methods of forming a structure on a substrate surface further comprise subjecting the substrate surface to a pretreatment process prior to forming a metal selenide or telluride thin film on the substrate. In some embodiments methods of forming a structure on a substrate surface further comprise forming a capping layer over the metal selenide or telluride thin film prior to forming the conductive layer. In some embodiments the capping layer comprises a dielectric material. In some embodiments forming a conductive layer over the metal selenide or telluride thin film comprises forming a conductive layer directly over the metal selenide or telluride thin film. In some embodiments the substrate surface comprises a metal or metals and the metal of the metal selenide or telluride thin film is different from the metal or metals of the underlying substrate surface. In some embodiments the capping layer comprises a metal or metals and the metal of the metal selenide or telluride thin film is different from the metal or metals of the subsequently formed capping layer. In some embodiments the capping layer comprises a metal or metals and the metal of the metal selenide or telluride thin film is the same as at least one of the metal or metals of the subsequently formed capping layer. In some embodiments the capping layer comprises a high-k dielectric material. In some embodiments the metal selenide or telluride thin film comprises at least one of the following metals: Be, Mg, Ca, Ba, Sr, Y, Sc, La, Ce, Pr, Nd, Pm, Sm, Eu, Gd, Tb, Dy, Ho, Er, Tm, Yb, Lu, Al, Si, Zn, Cd, Pb, In, Ga, Ge, Gd, Ta, Mo, and W. In some embodiments the metal selenide or telluride thin film comprises at least one of the following materials: MgSe, MgTe, CaSe, CaTe, SrSe, SrTe, BaSe, and BaTe. In some embodiments the metal selenide or telluride thin film has a thickness between about 0.1 nm and about 5 nm.

In some aspects, methods of forming a structure on a substrate surface are provided in which a metal selenide or telluride film is formed by ALD. In some embodiments the method comprises: forming a metal selenide or telluride thin film on the substrate surface using an atomic layer deposition (ALD) process, and forming a dielectric layer over the metal selenide or telluride thin film. In some embodiments the metal of the metal selenide or telluride thin film comprises at least one of the following metals: Be, Mg, Ca, Ba, Sr, Y, Sc, La, Ce, Pr, Nd, Pm, Sm, Eu, Gd, Tb, Dy, Ho, Er, Tm, Yb, Lu, Al, Si, Zn, Cd, Pb, In, Ga, Ge, Gd, Ta, Mo, and W. In some embodiments the method further comprises forming a capping layer over the metal selenide or telluride thin film prior to forming the dielectric layer. In some embodiments the method further comprises forming a conductive layer over the dielectric layer. In some embodiments the substrate surface comprises a high-mobility channel. In some embodiments the metal selenide or telluride thin film has a thickness between about 5 Å and about 20 Å. In some embodiments the metal selenide or telluride thin film comprises at least one of the following materials: MgSe, MgTe, CaSe, CaTe, SrSe, SrTe, BaSe, and BaTe.

In some aspects, methods of forming a gate stack on a substrate surface are provided. In some embodiments the method comprises: depositing a metal selenide or telluride thin film directly on a high-mobility channel on a substrate using an ALD process, and depositing a high-k dielectric layer directly over the metal selenide or telluride thin film. In some embodiments the metal of the metal selenide or telluride thin film comprises at least one of the following materials: MgSe, MgTe, CaSe, CaTe, SrSe, SrTe, BaSe, and BaTe. In some embodiments the method further comprises depositing a gate electrode over the high-k dielectric layer. In some embodiments the metal selenide or telluride thin film is formed using a selenium or tellurium precursor selected from the following: elemental selenium, elemental tellurium, selenium plasma, tellurium plasma, $H_2Se$, and $H_2Te$. In some embodiments the metal of the metal selenide or telluride thin film comprises at least one of the following metals Be, Mg, Ca, Ba, Sr, Y, Sc, La, Ce, Pr, Nd, Pm, Sm, Eu, Gd, Tb, Dy, Ho, Er, Tm, Yb, Lu, Al, Si, Zn, Cd, Pb, In, Ga, Ge, Gd, Ta, Mo, and W.

BRIEF DESCRIPTION OF THE DRAWINGS

The invention will be better understood from the detailed description and from the appended drawings, which are meant to illustrate and not to limit the invention, and wherein.

DETAILED DESCRIPTION

In some embodiments, metal selenide or telluride thin films, methods of forming metal selenide or telluride thin films, metal selenide or telluride structures, methods of forming metal selenide and telluride structures, and methods of forming three-dimensional architectures incorporating metal selenide or telluride thin films are provided. In some embodiments, the metal of the metal selenide or telluride thin film may be selected from any number of metals, such as magnesium, calcium, strontium, and barium.

Figure 1:
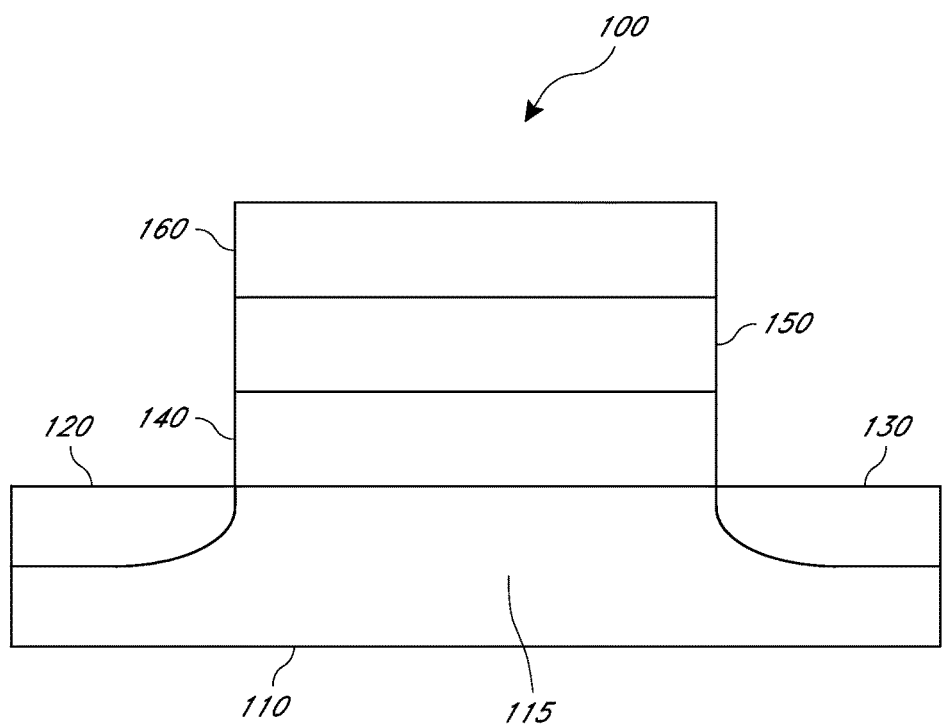
FIG. 1 is a schematic representation of a gate stack that includes an interface layer.

In some embodiments, a metal selenide or telluride film is used as an interface layer, for example between a substrate and a dielectric layer. In some embodiments a separate dielectric layer is not required and a metal selenide or telluride film may serve as a dielectric without another dielectric material present. In some embodiments, the interface layer comprises a part of a gate stack. In some embodiments, the interface layer is located between a dielectric layer and a high-mobility channel. FIG. 1 illustrates a common gate stack configuration 100 that is formed on a substrate 110. A high mobility channel 115 is located between a source 120 and a drain 130. A metal selenide or telluride interface layer 140 may be included between the high-mobility channel and the dielectric layer 150. A conductive layer 160 is present over the dielectric layer 150. In some embodiments the metal selenide or telluride interface layer 140 may be formed using the methods described herein, for example by an ALD process as disclosed herein.

In some embodiments, the metal in the metal selenide or telluride thin film is chosen so as to be distinct from the metal in the underlying portion of the substrate. For example the metal in a metal selenide or telluride film may be different from any metal in an underlying high-mobility channel. In some embodiments the metal in the metal selenide or telluride film may be different from the metal in an overlying dielectric layer. In some embodiments a metal selenide or telluride interlayer may comprise a metal that is different from any metal in an underlying channel region of the substrate and from an overlying dielectric layer.

In some embodiments a metal selenide or telluride interface layer comprises one or more of following metals: Be, Mg, Ca, Ba, Sr, Y, Sc, La, Ce, Pr, Nd, Pm, Sm, Eu, Gd, Tb, Dy, Ho, Er, Tm, Yb, Lu, Al, Si, Zn, Cd, Pb, In, Ga, Ge, Gd, Ta, Mo, and W.

In some embodiments, suitable interfacial layers comprise a metal selenide or telluride material that may protect the underlying high-mobility substrate material from undesirable oxidation. In some embodiments, the metal selenide or telluride thin film may be considered a passivation layer. In some embodiments, gate stacks formed with the presently disclosed interfacial or dielectric layers exhibit reduced leakage or reduced charge.

The presently disclosed metal selenide or telluride films may be incorporated into a variety of integrated circuit architectures, such as FINFETs, planar transistors, vertical nanowire transistors, capacitors, power transistors, etc.

Figure 2:
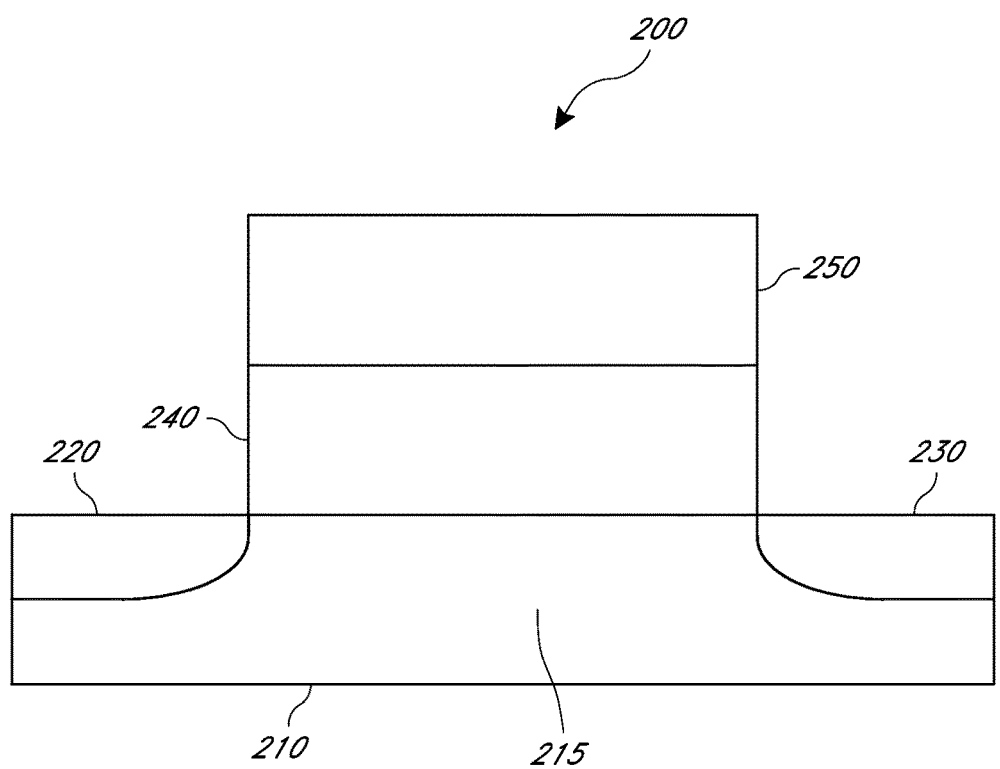
FIG. 2 is a schematic representation of a Metal-Insulator-Semiconductor (MIS) gate stack that includes a metal selenide or telluride dielectric layer.

In some embodiments, a metal selenide or telluride film is used as a dielectric layer, for example between a metal and a semiconductor in a metal-insulator-semiconductor (MIS) structure. In some embodiments, the dielectric layer comprises a part of a gate stack, for example in a MISFET. In some embodiments, the dielectric layer is located between a conductive layer and a high-mobility channel. FIG. 2 illustrates a common MIS gate stack configuration 200 that is formed on a substrate 210. A high mobility channel 215 is located between a source 220 and a drain 230. A metal selenide or telluride dielectric layer 240 is included between the high mobility channel 215 and a conductive layer 250. In some embodiments, the metal selenide or telluride dielectric layer 240 may be formed using the methods described herein.

In some embodiments, the metal in the metal selenide or telluride thin film is chosen so as to be distinct from the metal in the underlying portion of the substrate. For example the metal in a metal selenide or telluride film may be different from any metal in an underlying high-mobility channel. In some embodiments the metal in the metal selenide or telluride film may be different from a metal in an overlying conductive. In some embodiments a metal selenide or telluride dielectric layer may comprises a metal that is different from any metal in an underlying channel region of the substrate and from an overlying conductive layer.

In some embodiments a metal selenide or telluride dielectric layer comprises one or more following metals: Be, Mg, Ca, Ba, Sr, Y, Sc, La, Ce, Pr, Nd, Pm, Sm, Eu, Gd, Tb, Dy, Ho, Er, Tm, Yb, Lu, Al, Si, Zn, Cd, Pb, In, Ga, Ge, Gd, Ta, Mo, and W. In some embodiments when a metal selenide or telluride thin film forms part of a three-dimensional architecture, particular metals are expressly avoided, such as cesium and/or aluminum.

In some embodiments, suitable dielectric layers comprise a metal selenide or telluride material that may serve as a gate dielectric. In some embodiments the metal selenide or telluride thin film may be considered a passivation layer, in addition to a dielectric layer. In some embodiments, suitable dielectric layers comprise a metal selenide or telluride material that may allow for easier integration due to a lack of nucleation sites as might normally be present in a semiconductor layer.

The presently disclosed metal selenide or telluride films may be incorporated into a variety of integrated circuit architectures, such as MISFETs.

In some embodiments, the methods for forming metal selenide or telluride thin films comprise an ALD process. For example, a substrate may be alternately and sequentially contacted with a first reactant comprising metal (also referred to as a metal precursor) and a second reactant comprising selenium or tellurium (also referred to as a selenium or tellurium precursor). The metal precursor may be selected to provide the desired metal in the metal selenide or telluride interface or dielectric layer. Thus, in some embodiments the metal reactant is selected to provide a metal that is different from a metal in the underlying substrate region and/or from a metal in a dielectric layer or metal layer that is to be subsequently deposited. In some embodiments a metal selenide or telluride film comprising one or more of following metals: Be, Mg, Ca, Ba, Sr, Y, Sc, La, Ce, Pr, Nd, Pm, Sm, Eu, Gd, Tb, Dy, Ho, Er, Tm, Yb, Lu, Al, Si, Zn, Cd, Pb, In, Ga, Ge, Gd, Ta, Mo, and W. is deposited by an ALD process.

In some embodiments, methods of forming a metal selenide or telluride film comprise an ALD cycle in which a metal source chemical and a selenium or tellurium source chemical are alternatively and sequentially pulsed into a reaction space comprising a substrate. The metal source chemical is provided to the reaction space where at least some of the metal source chemical contacts and adsorbs to the substrate surface. The selenium or tellurium source chemical is subsequently provided to the reaction space and reacts with the adsorbed metal source chemical to form metal selenide or telluride. In some embodiments, the selenium or tellurium source chemical may precede the metal source chemical. In some such embodiments selenium or tellurium may bond to the substrate and the subsequent metal source chemical reacts with deposited selenium or tellurium, or a selenium or tellurium source chemical may change or remove and replace the surface termination to selenium-$H_x$-groups, tellurium-$H_x$-groups or other surface species comprising selenium or tellurium.

In some embodiments, reactants and reaction by-products are removed from the reaction space between provision of the metal source chemical and a selenium or tellurium source chemical. Removal may occur before and/or after each reactant pulse. Reactants and reaction by-products may be removed with the aid of a purge gas and/or by subjecting the reaction space to a low pressure produced by a vacuum pump to evacuate the reaction space.

The step of exposing the substrate to a metal source chemical may be referred to as a metal phase, and the step of exposing the substrate to a selenium or tellurium source chemical may be referred to as a selenium or tellurium phase. In some embodiments, it may be desirable to repeat one or both of the metal phase and a selenium or tellurium phase one, two, three, four, five or more times before proceeding to the next phase.

Such an ALD cycle is repeated as desired to form a film of a desirable thickness. In some embodiments, the ALD cycle is repeated until a complete, closed layer of a metal selenide or telluride is formed. In some embodiments, the ALD cycle is repeated until a physically continuous layer of a metal selenide or telluride is formed. In some embodiments, the ALD cycle is repeated until a minimum thickness is reached in which the deposited layer gives desired electrical properties. In some embodiments, the desirable thickness will be a thickness considered thick enough to completely cover a channel area of the substrate surface. In some embodiments, the desirable thickness is a thickness sufficient to substantially prevent oxidation of the underlying channel material of the substrate, such as during subsequent processing. In some embodiments, the desirable thickness is a thickness sufficient to act as a dielectric in a MIS structure.

In some embodiments, a substrate surface may be subjected to a pretreatment process. In some embodiments, a pretreatment process comprises exposing the substrate surface to a pretreatment reactant that removes undesirable contaminants and/or prepares the substrate surface for the subsequent formation of a metal selenide or telluride layer. A pretreatment may comprise, for example, providing one or more of a pulse or a rinse of HCl, HF, or a selenide or telluride containing compound, such as a hydrogen selenide or telluride. In some embodiments, a pretreatment may comprise a selenide or telluride passivation process.

In some embodiments, metal selenide or tellurides are formed that consist essentially of metal and selenium or tellurium. In some embodiments, additional reactants may be used to incorporate into or contribute other materials to the film, for example oxygen to form metal oxy-selenide or tellurides. In some embodiments a compound metal selenide or telluride may be formed, comprising two or more different metals. For example, a metal selenide or telluride film may comprise MgAlSe, MgAsTe, MgSiSe, or MgSiTe. In some embodiments where additional non-metal elements in addition to a selenium or tellurium are desired, an ALD process for forming the metal selenide or telluride thin film may comprise phases in addition to the initial metal and selenium or tellurium phases. For example, they may include an oxidation phase where metal oxy-selenides or oxy-tellurides are desired. In an oxidation phase, oxygen or an oxygen-containing precursor is provided in the reaction chamber and allowed to contact the substrate surface. The oxygen phase may be part of one or more deposition cycles. In some embodiments, a separate nitrogen phase may be included in one or more deposition cycles. In some embodiments a second metal phase may be provided in one or more deposition cycles. The oxidation phase, or other desirable phase, may follow the metal phase or the selenium or tellurium phase, but in either situation, it is desirable in some embodiments, to remove excess oxygen (or other reactant) and any reaction by-products from the reaction space before proceeding to the next phase. In some embodiments an additional phase, such as an oxygen, nitrogen or additional metal phase may be provided after the final deposition cycle, or intermittently in the deposition process.

According to some embodiments, a desirable metal selenide or telluride of the present disclosure will include one or more metals and at least one element (such as oxygen or nitrogen) in addition to selenium or tellurium. Thus, ternary and quaternary compositions would serve as suitable metal selenide or tellurides. Examples include, but are not limited to MgSeN, MgTeN, BeSeN, BeTeN, SrSeN, SrTeN, CaSeN, CaTeN, etc.

In some embodiments, the deposited metal selenide or telluride comprises at least about 5 at-% of selenium or tellurium, preferably more than about 15 at-% of selenium or tellurium and more preferably more than about 30 at-% of selenium or tellurium and most preferably more than about 40 at-% of selenium or tellurium. Depending on the metal oxidation state the metal selenide or telluride may comprise selenium or tellurium from about 45 at-% to about 75 at-%.

In some embodiments, a magnesium selenide or telluride ($MgSe_x$, $MgTe_x$) is formed. In some embodiments, the metal selenide or telluride thin film may comprise other metals, such as calcium, strontium, and barium as described in more detail herein elsewhere.

In some embodiments, such as where the metal selenide or telluride thin film is incorporated into a three-dimensional architecture, metals in addition to those listed above may be considered for use in forming the metal selenide or telluride thin film. Metals, such as yttrium, silicon, zinc, cadmium, lead, indium, gallium, germanium, tantalum, molybdenum, and tungsten could be suitably utilized. In some embodiments, the chosen metal may be selected based on, for example, the substrate, the dielectric layer, and/or the metal layer used in the architecture. For example, in some embodiments it is desirable that the metal selenide or telluride thin film, when acting as an interface layer between a high-mobility channel and a dielectric layer, utilize a metal that is distinct from the metals used in one or both the channel and the dielectric layer. In some embodiments it is desirable that the metal selenide or telluride thin film, when acting as a dielectric layer between a high-mobility channel and a metal layer, utilize a metal that is distinct from the metals used in one or both the channel and the metal layer. In an embodiment where a three-dimensional architecture is formed, it may be desirable to subject the high-mobility channel or substrate to a pretreatment prior to forming a metal selenide or telluride interface layer or dielectric layer. A dielectric layer or metal layer may then be formed over the metal selenide or telluride, and a post deposition treatment may be applied before, after, or before and after the formation of the dielectric or metal layer. In some embodiments, where a dielectric layer is formed over the metal selenide or telluride, a subsequent layer, such a conductive layer can then be formed over the dielectric layer.

Geometrically challenging applications are also possible due to the nature of the ALD-type processes. The substrate surface may comprise one or more three-dimensional architectures. In some embodiments one or more structures may have an aspect ratio of 1:1 to 10:1 or greater.

The thickness of the film formed according to some embodiments is equal to about 0.1 nm and less than or equal to about 5 nm; however, the actual thickness chosen may depend on the intended application of the thin film. In some embodiments, the thickness will be between about 0.5 nm and about 3 nm. In some embodiments, the thickness will be between about 0.5 nm and about 2 nm, preferably about 1 nm. On the other hand, in some applications a thickness greater than 5 nm, 10 nm, or even 20 nm is desirable.

Atomic Layer Deposition ("ALD") of Metal Selenide or Telluride Thin Films

ALD type processes are based on controlled, self-limiting surface reactions and can provide precise control of the film composition. Gas phase reactions are avoided by contacting the substrate alternately and sequentially with reactants. Vapor phase reactants are separated from each other in the reaction chamber, for example, by removing excess reactants and/or reactant byproducts from the reaction chamber between reactant pulses. Removing excess reactants and/or reactant byproducts may be achieved, for example, by purging the reaction space after each pulse of reactant gas using a vacuum and/or a purge gas. A purge gas may also be flowed continuously before, during, and after each pulse of reactant gas. For example, in some embodiments the purge gas may also serve as a carrier gas for one or more of the reactants.

Briefly, a substrate is loaded into a reaction chamber and is heated to a suitable deposition temperature, generally at lowered pressure. In some embodiments, the substrate surface on which deposition is to take place comprises silicon. In some embodiments the substrate surface on which deposition is to take place comprises germanium. In some embodiments, the substrate surface comprises one or more III-V materials. In some embodiments, the substrate surface on which deposition is to take place comprises a high-mobility material. In some embodiments, the substrate surface comprises InGaAs. Other suitable substrate surfaces include, GaAs, InP, InAs, and GaSb. In some embodiments the substrate may be a 300 mm or a 450 mm wafer. In some embodiments, the substrate surface comprises multiple materials, such as one or more III-V materials, silicon, silicon oxide, silicon nitride, $Si_xGe_{1-x}$ or Ge.

Deposition temperatures are maintained below the precursor thermal decomposition temperature but at a high enough level to avoid condensation of reactants and to provide the activation energy for the desired surface reactions. Of course, the appropriate temperature window for any given ALD reaction will depend upon the surface termination and reactant species involved. The reaction temperature may be from about room temperature to about 500° C. or from about 20° C. to about 500° C. In some embodiments, the reaction temperature is from about room temperature to about 400° C. In some embodiments, the reaction temperature is from about 150° C. to about 400° C., from about 200° C. to about 350° C., or from about 250° C. to about 300° C.

The reaction pressure may be from about 0.1 Torr to about 760 Torr. In some embodiments, the reaction pressure may be from about 0.5 Torr to about atmospheric pressure.

In some embodiments, at least one ALD cycle is used to form a metal selenide or telluride thin film. The film formed according to some embodiments is between about 1 Å and about 20 Å; however, the actual thickness chosen may be selected based on the intended application of the thin film. In some embodiments, it is desirable to ensure that all or most of a target substrate surface is covered by an interfacial layer. In such cases, it may be desirable to form a film that is at least about 5 Å, preferably 10 Å thick or greater than 10 Å. In some embodiments, thicknesses of 2 Å, 3 Å, 4 Å, or even 5 Å will sufficiently cover the target substrate surface, e.g., a channel region. In some embodiments, such as where the film is to be incorporated into a capacitor, it may be desirable to limit the film's thickness to no more than about 20 Å with 15 Å or even 10 Å being the most desirable in some cases. It has been found, in some cases, that capacitance is undesirably reduced if too thick of a film is used. In some embodiments it is desirable to form a film that can act as a dielectric in a gate stack. In such cases is may be desirable to form a film that is at least about 0.5 nm, preferably 1 nm thick or greater than 1 nm thick. In some embodiments, thicknesses of 0.5 nm to 5 nm will be sufficient to act as a dielectric in a gate stack. For other applications, thicknesses greater than about 5 nm may be desirable. For example, films having a thickness of 10 nm, 20 nm, or greater than 20 nm may be desirable in some applications, such as power transistors. Because of the various constraints and advantages of the film's thickness, in some embodiments it may be desirable to form films having a thickness that is between about 0.1 nm and about 2 nm. In some embodiments it may be desirable to form films with certain number of deposition cycles, such from about 5 deposition cycles to about 20 deposition cycles, preferably from about 7 cycles to about 15 cycles, instead of a target thickness.

As mentioned above, each pulse or phase of each cycle is preferably self-limiting. An excess of reactant is supplied in each phase to saturate the susceptible structure surfaces. Surface saturation ensures reactant occupation of all available reactive sites (subject, for example, to physical size or "steric hindrance" restraints) and thus provides excellent step coverage. In some arrangements, the degree of self-limiting behavior can be adjusted by, e.g., allowing some overlap of reactant pulses to trade off deposition speed (by allowing some CVD-type reactions) against conformality. Ideal ALD conditions with reactants well separated in time and space provide self-limiting behavior and thus maximum conformality. In some embodiments, less than a complete monolayer is deposited in one or more cycles, for example due to steric hindrance. In some embodiments, more than one monolayer may be deposited by, for example, adjusting the conditions to achieve some decomposition reaction, such as would occur in CVD or CVD-like processes. Limited CVD reactions mixed with the self-limiting ALD reactions can raise the deposition rate.

Examples of suitable reactors that may be used include commercially available ALD equipment such as the F-120® reactor, Pulsar® reactor and Advance® 400 Series reactor, available from ASM America, Inc of Phoenix, Ariz. and ASM Europe B.V., Almere, Netherlands. In addition to these ALD reactors, many other kinds of reactors capable of ALD growth of thin films, including CVD reactors equipped with appropriate equipment and means for pulsing the precursors can be employed. In some embodiments a flow type ALD reactor is used.

In some embodiments the reactor is a batch reactor and has more than about 50 substrates, more than about 100 substrates or more than about 125 substrates. In some embodiments the reactor is a mini-batch reactor and has from about 2 to about 20 substrates, from about 3 to about 15 substrates or from about 4 to about 10 substrates.

The metal selenide or telluride ALD processes described herein can optionally be carried out in a reactor or reaction space connected to a cluster tool. In a cluster tool, because each reaction space is dedicated to one type of process, the temperature of the reaction space in each module can be kept constant, which improves the throughput compared to a reactor in which is the substrate is heated up to the process temperature before each run.

A stand-alone reactor can be equipped with a load-lock. In that case, it is not necessary to cool down the reaction space between each run.

Preferably, for forming metal selenide or telluride films, each ALD cycle comprises at least two distinct phases. The provision and removal of a reactant from the reaction space may be considered a phase. For a metal deposition cycle, in a first metal phase, a first reactant comprising a suitable metal—such as magnesium, calcium, strontium, or barium—is provided and forms no more than about one monolayer on the substrate surface. This reactant is also referred to herein as "the metal precursor," "metal reactant," or "metal source chemical" and may be, for example, the corresponding beta-diketonate precursors and cyclopentadienyl-based precursors of the metals listed above. In a second selenium or tellurium phase, a second reactant comprising selenium or tellurium is provided and may convert adsorbed metal reactant to a metal selenide or telluride. This reactant is also referred to herein as "the selenium or tellurium precursor," "selenium or tellurium reactant," or "selenium or tellurium source chemical" and may be, for example, a hydrogen selenide or telluride, for example $H_2Se$, or $H_2Te$. One or more of the reactants may be provided with the aid of a carrier gas, such as $N_2$, Ar, or He. Additional phases may be added and phases may be removed as desired to adjust the composition of the final film.

The terms "first" and "second" may be applied to any particular precursor depending on the sequencing of any particular embodiment. For example, depending on the embodiment the first reactant can be either a metal precursor or a selenium or tellurium precursor.

Figure 3:
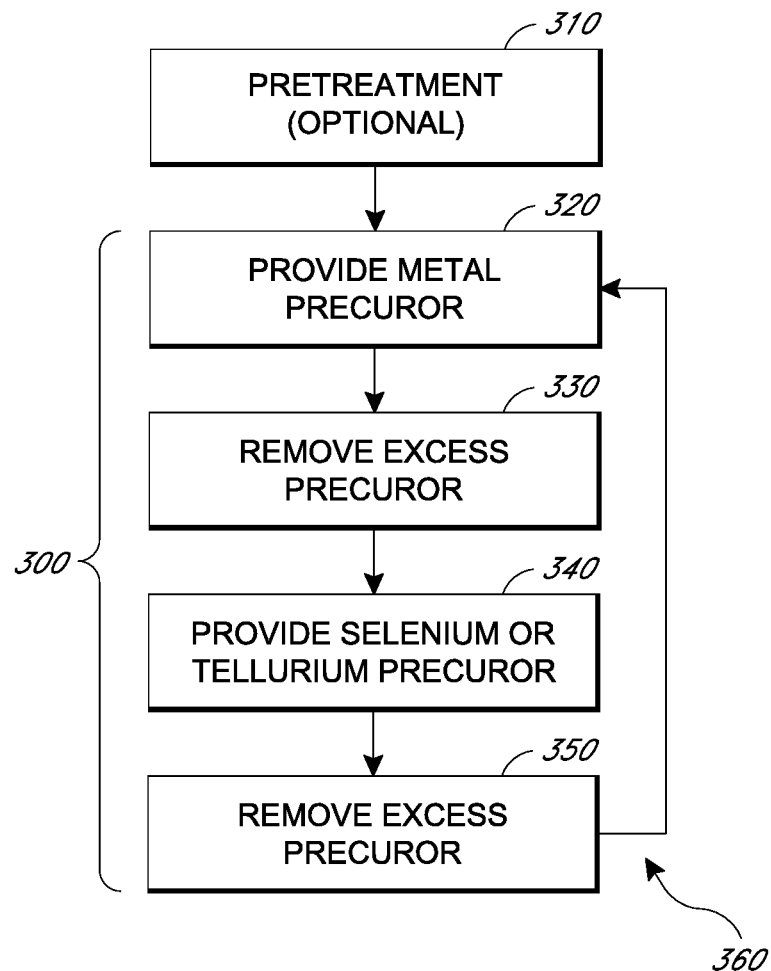
FIG. 3 is a flow chart illustrating an ALD process for forming a metal selenide or telluride thin film according to some embodiments.

FIG. 3 illustrates that, according to some embodiments, a metal selenide or telluride thin film is formed by an ALD-type process comprising multiple pulsing cycles 300, at least one cycle comprising:

pulsing a vaporized first metal precursor at step 320 into the reaction chamber to form at most a molecular monolayer of the metal precursor on the substrate, purging the reaction chamber at step 330 to remove excess metal precursor and reaction by products, if any, providing a pulse of a second selenium or tellurium precursor to contact the substrate at step 340, purging the reaction chamber at step 350 to remove excess second selenium or tellurium precursor and any gaseous by-products formed in the reaction between the metal precursor layer on the substrate and the second reactant, and repeating the pulsing and purging steps at step 360 until a metal selenide or telluride thin film of the desired thickness has been formed.

Purging the reaction chamber may comprise the use of a purge gas and/or the application of a vacuum to the reaction space. Where a purge gas is used, the purge gas may flow continuously or may be flowed through the reaction space only after the flow of a reactant gas has been stopped and before the next reactant gas begins flowing through the reaction space. It is also possible to continuously flow a purge or non-reactive gas through the reaction chamber so as to utilize the non-reactive gas as a carrier gas for the various reactive species. Thus, in some embodiments, a gas, such as nitrogen, continuously flows through the reaction space while the metal and selenium or tellurium precursors are pulsed as necessary into the reaction chamber. Because the carrier gas is continuously flowing, removing excess reactant or reaction by-products is achieved by merely stopping the flow of reactant gas into the reaction space.

According to some embodiments, a metal selenide or telluride thin film is formed by an ALD-type process comprising multiple pulsing cycles, each cycle comprising:

pulsing a vaporized first metal precursor into the reaction chamber to form at most a molecular monolayer of the metal precursor on the substrate, providing a pulse of a second selenium or tellurium precursor onto the substrate, repeating the pulsing steps until a magnesium selenide or telluride thin film of the desired thickness has been formed.

In some embodiments, the ratio of metal precursor pulses to selenium or tellurium precursor pulses is adjusted. Thus, in some embodiments, a metal precursor is pulsed into the reaction chamber more than once relative to the pulse of the selenide or telluride precursor in at least one cycle. And in some embodiments, the selenide or telluride precursor is pulsed into the reaction chamber more than once relative to the pulse of the metal precursor in at least one cycle. For example, if increasing the amount of metal in the film is desired, at least one ALD cycle, every other ALD cycle, or every third, fourth, fifth, sixth cycle, etc. could include one or more additional metal precursor pulses. Similarly, if increasing the amount of selenide or telluride in the film is desired, at least one ALD cycle, every other ALD cycle, or every third, fourth, fifth, sixth cycle, etc. could include one or more additional selenium or tellurium precursor pulses.

In some embodiments, it is desirable to incorporate at least two metals into the metal selenide or telluride thin film. Thus, in an appropriate ALD cycle, one or more cycles may include a pulse of a second, third, or fourth metal in addition to or in lieu of the first metal. For example, in some embodiments, the metal selenide or telluride film comprises aluminum and magnesium. In some embodiments, the metal selenide or telluride film comprises silicon and magnesium. In some embodiments, the metal selenide or telluride film comprises hafnium and magnesium. For example, pulses of Al and Mg may be used in combination with Se, or Te precursor pulses to form AlMgSe, or AlMgTe. Similarly, Si and Mg pulses or Si and Hf pulses may be used in combination with Se, or Te precursor pulses to form, MgSiSe, MgSiTe, MgHfS, MgHfSe, or MgHfTe, respectively. Without being tied to any particular, it is believed the use of more than one metal may achieve particular benefits, such as suppressed crystallization at elevated temperatures, minimized hygroscopic characteristics, and/or enhanced dielectric constants.

Referring again to FIG. 3, which illustrates an exemplary metal selenide or telluride deposition process 300. Some embodiments may include a pretreatment process at step 301 applied to the substrate surface. A pretreatment may comprise one or more steps. In the pretreatment, the substrate surface on which the metal selenide or telluride is to be deposited may be exposed to one or more pretreatment reactants and/or to specific conditions, such as temperature or pressure. A pretreatment may be used for any number of reasons including to clean the substrate surface, remove impurities, remove native oxide, and provide desirable surface terminations. In some embodiments, a pretreatment comprises exposing the substrate surface to one or more pretreatment reactant, such as HCl, HBr, $Cl_2$, HF, an ammonium selenide or telluride, or a hydrogen selenide or telluride. In some embodiments, a pretreatment process is carried out at about the same temperature as the subsequent deposition process. In some embodiments, a pretreatment process comprises one or more pulses of a suitable chemical, the pulses ranging from about 0.05 s to about 600 s, preferably from about 0.1 s to about 60 s. In some embodiments, the pressure during a pretreatment process is maintained between about 0.01 Torr and about 100 Torr, preferably from about 0.1 Torr to about 10 Torr.

In some embodiments, such as where a III-V material is used, HCl may be used as the pretreatment reactant. In some embodiments, such as where a germanium substrate is used, HF may be used as the pretreatment reactant. In some embodiments, multiple pretreatment reactants are used sequentially or simultaneously. In some embodiments, a pretreatment may involve multiple applications of one or more pretreatment reactants.

In some embodiments, a pretreatment may comprise first exposing the substrate surface to HCl for a period of time and then exposing the substrate surface to a hydrogen selenide or telluride for a period of time. Additional steps may also be included. For example, in some embodiments, water may be used to wash the substrate surface between the respective HCl and hydrogen selenide or telluride exposures. Thus, in one possible pretreatment, a suitable substrate surface may be exposed to HCl for a period of between 1 s and 5 minutes, washed with deionized (DI) $H_2O$ twice for about a period of between about 1 s and 60 s, and exposed to two exposures of hydrogen selenide or telluride for a period of about 1 s to about 60 s at. The preceding process may occur at any suitable temperature such as between about 100° C. and about 400° C.

According to some embodiments, a pretreatment may comprise an ex-situ wet clean treatment followed by one or more in-situ processes. The in-situ process may comprise multiple stages with different pretreatment reactants. For example, one in-situ sequence could comprise alternating exposure to HCl and a hydrogen selenide or telluride, for example $H_2Se$, or $H_2Te$ (HCl—$H_2Se$—HCl—$H_2Se$, etc.). Of course, it will be recognized that other combinations or other pretreatment reactants in similar or different combinations may also be used.

In some embodiments, the substrate surface is pretreated with a selenium-containing or tellurium-containing compound. In some embodiments, the selenium-containing or tellurium-containing compound may be the same as or different from the selenium or tellurium precursor used in a subsequent metal selenide or telluride deposition process.

According to some embodiments, a selenium-containing or tellurium-containing pretreatment agent comprises a selenol or tellurol with a general formula of R—Se—H or R—Te—H, wherein R can be an alkane, an alkene, or other carbon-containing group of atoms. In some embodiments, the selenium-containing or tellurium-containing pretreatment reactant comprises plasma or radicals derived from selenium-containing or tellurium-containing species. In some embodiments, the pretreatment agent comprises elemental selenium or tellurium. The use of a pretreatment reactant comprising selenium or tellurium may provide —SeH or —TeH terminations on the substrate surface. In such situations, the subsequent exposure to a metal precursor, such as a magnesium precursor, will result in the immediate formation of Mg-selenium or Mg-tellurium bonds and the beginning of a metal selenide or telluride film, such as a MgSe or MgTe thin film. In some embodiments, a pretreatment is provided ex situ or in situ and may be provided as a liquid bath or by exposure to a vapor phase of a pretreatment reactant. In some embodiments, the pretreatment process comprises a selenium or tellurium passivation process.

In some embodiments, surface terminations other than selenium-H or tellurium-H terminations may be desired. In such instances, it may be desirable to use a non-selenium-containing or non-tellurium pretreatment reactant. For example, in some embodiments, the pretreatment reactant may provide N—H terminations on the substrate surface. In some embodiments, such pretreatments could comprise an $NH_3$ anneal, $N_2$ plasma treatment, or exposure to $N_2H_4$, though other methods and other nitrogen-containing compounds may also be used. Similar to the result that may be achieved using selenium-containing or tellurium-containing pretreatment reactants, the use of nitrogen-containing reactants may achieve N—H terminations on the substrate surface.

A pretreatment process may utilize pretreatment reactants in vapor form and or in liquid form. In some embodiments, the pretreatment process may be carried out at the same temperature and/or pressure as the subsequent deposition process. In some embodiments, the pretreatment process may resemble the subsequent deposition process except that the pretreatment process will involve a longer pulse time or exposure time than used in the subsequent deposition process.

In some specific embodiments, HCl may be used as the pretreatment chemical and may be used in liquid form and the HCl may diluted (e.g., 1 (37%): 10) and may be used in a 1 minute etch. In some embodiments, the duration of the pretreatment process can be varied broadly without affecting the film properties of the subsequently deposited films.

The pretreatment process may be performed at the same temperature and/or pressure as the subsequent ALD process; however, it may also be performed at a different temperature and/or pressure. In embodiments where the pretreatment is performed ex situ, it may be impossible or undesirable to perform the pretreatment at the same temperature and/or pressure as the subsequent ALD process. For example, where a pretreatment involves the immersion of the substrate in an aqueous solution, it may be desirable to allow the pretreatment to proceed at a higher pressure than the ALD process, which may be performed at relatively low pressures that could undesirably evaporate the pretreatment reactant.

Referring again to FIG. 3, a first metal reactant or precursor is conducted into the chamber at step 320 in the form of vapor phase pulse and contacted with the surface of the substrate. Conditions are preferably selected such that no more than about one monolayer of the precursor is adsorbed on the substrate surface in a self-limiting manner.

At step 330 excess first reactant and reaction byproducts, if any, are removed from the reaction chamber, often by purging with a pulse of inert gas such as nitrogen or argon. Purging the reaction chamber means that vapor phase precursors and/or vapor phase byproducts are removed from the reaction chamber such as by evacuating the chamber with a vacuum pump and/or by replacing the gas inside the reactor with an inert gas such as argon or nitrogen. Typical purging times are from about 0.05 to 20 seconds, more preferably between about 1 and 10 seconds, and still more preferably between about 1 and 2 seconds. However, other purge times can be utilized if necessary, such as when depositing layers over extremely high aspect ratio structures or other structures with complex surface morphology is needed. The appropriate pulsing times can be readily determined by the skilled artisan based on the particular circumstances.

At step 340 a second gaseous, reactant comprising selenium or tellurium (also referred to as a selenium or tellurium reactant or selenium or tellurium precursor) is pulsed into the chamber where it reacts with the first reactant bound to the surface. The reaction forms up to a monolayer of metal selenide or telluride on the substrate surface.

At step 350, excess second reactant and gaseous by-products of the surface reaction, if any, are removed from of the reaction chamber, as described above for step 330. In some embodiments excess reactant and reaction byproducts are preferably removed with the aid of an inert gas.

The steps of pulsing and purging are repeated at step 360 until a thin film of the desired thickness has been formed on the substrate, with each cycle leaving no more than a molecular monolayer. In some cases, it might be desirable to achieve at least partial decomposition of at least one the various precursors.

Additional reactants can also be supplied that, in some embodiments, do not contribute elements to the growing film. Such reactants can be provided either in their own pulses or along with the metal and/or selenium or tellurium precursor pulses. The additional reactants can be used, for example, to provide a desired surface termination, or to strip or getter ligands from one or more of the reactants and/or free by-product.

In some embodiments, additional reactants are used in order to contribute additional species, such as oxygen or nitrogen, to the growing thin film. In some embodiments, the additional reactants may be provided in the same phase as another precursor, such as during the metal phase or the selenium or tellurium phase. In some embodiments, the additional reactant or reactants constitute their own phase or phases and are provided separate from both the metal and selenium or tellurium phases. Whether provided with another phase or separately, the additional reactant(s) may be provided in every cycle, some cycles, or only in one cycle in the deposition process.

In some embodiments, one or more additional non-metal elements may be desired in the metal selenide or telluride film, such as nitrogen or oxygen. Additional phases can be incorporated in one or more deposition cycles, or provided after deposition of the metal selenide or telluride film, in order to incorporate such materials. For example, in some embodiments one or more cycles may include a nitrogen phase in which the substrate is exposed to a nitrogen reactant. In some embodiments, the nitrogen phase incorporates at least some nitrogen into the metal selenide or telluride thin film. In some embodiments, the nitrogen phase comprises exposing the substrate surface or growing film to $N_2$ plasma. In some embodiments, the nitrogen phase comprises subjecting the substrate surface or growing film to an annealing process using $NH_3$. In some embodiments, the nitrogen phase comprises subjecting the substrate surface or growing film to $N_2H_4$. In some embodiments, the nitrogen phase comprises exposing the substrate to nitrogen precursors, nitrogen radicals, atomic nitrogen, nitrogen plasma, or combinations thereof. A nitrogen phase can be included in one or more deposition cycles by providing a pulse of the nitrogen reactant and purging or after depositing some or all of the complete film. In some embodiments the nitrogen phase may follow the metal phase or the selenium or tellurium phase in one or more deposition cycles.

In some embodiments one or more cycles may include an oxygen phase in which the substrate is exposed to an oxygen reactant. In some embodiments, the oxygen phase incorporates at least some oxygen into the metal selenide or telluride thin film. In some embodiments, the oxygen phase comprises exposing the substrate surface or growing film to oxygen plasma. In some embodiments, the oxygen phase comprises subjecting the substrate surface or growing film to an annealing process in an oxygen atmosphere. In some embodiments, the oxygen phase comprises exposing the substrate to oxygen precursors, oxygen radicals, atomic oxygen, oxygen plasma, or combinations thereof. An oxygen phase can be included in one or more deposition cycles by providing a pulse of the oxygen reactant and purging or after depositing some or all of the complete film. In some embodiments the oxygen phase may follow the metal phase or the selenium or tellurium phase in one or more deposition cycles.

The metal selenide or telluride thin films of the present disclosure can include any number of metals. Accordingly, suitable metal precursors comprising the desired metal of the metal selenide or telluride can be selected. In some embodiments a metal selenide or telluride comprising Mg, Ca, Sr, and/or Ba is formed. In other embodiments a metal selenide or telluride comprising Be, Mg, Ca, Ba, Sr, Y, Sc, La, Ce, Pr, Nd, Pm, Sm, Eu, Gd, Tb, Dy, Ho, Er, Tm, Yb, Lu, Al, Si, Zn, Cd, Pb, In, Ga, Ge, Gd, Ta, Mo, or W is formed. Appropriate metal selenide or tellurides may include those that exhibit desirable characteristics, such as stability (e.g., does not reaction with substrate, capping layer, or air), high melting point (e.g., greater than about 1000° C., fewer charge trapping sites (e.g., $D_{it}$<5e11 $1/cm^2$), and a wide band gap (e.g., >3 eV).

According to some embodiments, a metal selenide or telluride thin film includes two or more metals. In some embodiments, additional deposition phases are added to one or more deposition cycles to incorporate the additional metal or metals. The additional metal phase(s) may follow the first metal phase or follow the selenium or tellurium phase. In some embodiments two or more different metal precursors may be provided simultaneously in the same metal phase of a deposition cycle. In some embodiments metal precursors comprising different metals may be used in different deposition cycles. For example, a first metal precursor may be the only metal precursor used in one or more deposition cycles and a second metal precursor comprising a second, different metal, may be used in one or more other deposition cycles.

And in some films having two or more metals, additional non-metals other than selenium or tellurium, such as oxygen or nitrogen, may also be included. Again, additional deposition phases may be added to one or more deposition cycles to incorporate the additional materials. Accordingly, it is possible to achieve metal selenide or telluride thin films with two or more metals, selenium or tellurium, and nitrogen or metal selenide or telluride thin films with two or more metals, selenium or tellurium, and oxygen. Examples include, but are not limited to, MgHfOSe, MgHfOTe, MgHfSe, MgHfTe, MgSiSe, MgSiTe, AlMgSe, AlMgTe, MgSeO, MgTeO, MgSeN and MgTeN.

In some embodiments, the additional elements may already comprise a part of either the metal precursor or the selenium or tellurium precursor. For example, either the metal or selenium or tellurium precursor may include oxygen or nitrogen, which could serve as the additional desirable component in the resulting metal selenide or telluride film. Where one or both of the metal and selenium or tellurium precursors also includes the additional element, it may be desirable to use that particular precursor in all or only some of the deposition cycles. For example, if the selenium or tellurium precursor includes the additional desirable element, such as oxygen, then that precursor could be used for only one or some of the deposition cycles while a different, non-oxygen-containing selenium or tellurium precursor is used for the remaining cycles.

In some such embodiments, the deposition may be performed as a two-step process, such as when forming a metal oxy-selenide or telluride thin film. Thus, the first step may involve the formation of a metal selenide or telluride film, and the second step may involve the formation or modification of the metal selenide or telluride film into a metal oxy-selenide or telluride film.

Similarly, a two-step process may be used to incorporate other materials, such as nitrogen, into the metal selenide or telluride film. For example, the first step may involve the formation of a metal selenide or telluride film, and the second step may involve the exposure of the metal selenide or telluride film to a nitrogen precursor or a nitrogen-rich atmosphere so as to incorporate at least some nitrogen in to the film.

MgSe, and MgTe have been chosen as exemplary metal selenide or tellurides for the sake of this disclosure. In some embodiments, the magnesium precursor is provided first in an ALD cycle for forming MgSe, or MgTe. After forming an initial surface termination, if necessary or desired, a first magnesium precursor pulse is supplied to the workpiece. In accordance with some embodiments, the first precursor pulse comprises a carrier gas flow and a volatile magnesium species that is reactive with the workpiece surfaces of interest. Exemplary magnesium precursors include magnesium beta-diketonates and cyclopentadienyl-based ("Cp") precursors, such as $MgCp_2$, which is desirable because of its high volatility and reactivity. Accordingly, the magnesium precursor adsorbs upon the workpiece surfaces. In some embodiments, the reaction is self-limiting such that the first precursor pulse self-saturates the workpiece surfaces such that any excess constituents of the first precursor pulse do not further react with the molecular layer formed by this process.

The first metal precursor pulse is preferably supplied in gaseous form. The metal precursor gas is considered "volatile" for purposes of the present description if the species exhibits sufficient vapor pressure under the process conditions to transport the species to the workpiece in sufficient concentration to saturate exposed surfaces.

In some embodiments the metal precursor pulse is from about 0.01 seconds to about 60 seconds, from about 0.02 seconds to about 30 seconds, from about 0.025 seconds to about 20 seconds, from about 0.05 seconds to about 5.0 seconds, about 0.05 seconds to about 2.0 seconds or about 0.1 seconds to about 1.0 second.

After sufficient time for a molecular layer to adsorb on the substrate surface, excess first precursor is then removed from the reaction space. In some embodiments the excess first precursor is purged by stopping the flow of the first chemistry while continuing to flow a carrier gas or purge gas for a sufficient time to diffuse or purge excess reactants and reactant by-products, if any, from the reaction space. In some embodiments the excess first precursor is purged with the aid of oxygen gas, or another purge gas, that is flowing throughout the ALD cycle.

In some embodiments, the first precursor is removed from the reaction space, which may involve a purge gas that flows for about 0.05 to 20 seconds, more preferably between about 1 and 10 seconds, and still more preferably between about 1 and 2 seconds.

In the second phase, a selenium or tellurium precursor is provided to the reaction space. The adsorbed first reactant may then react with the selenium or tellurium precursor to form a magnesium selenide or telluride, such as MgSe, or MgTe. In some embodiments the selenium or tellurium precursor pulse is from about 0.01 seconds to about 60 seconds, from about 0.02 seconds to about 30 seconds, from about 0.025 seconds to about 20 seconds, from about 0.05 seconds to about 5.0 seconds, about 0.05 seconds to about 2.0 seconds or about 0.1 seconds to about 1.0 second. However, depending on the reactor type, substrate type and its surface area, the selenium or tellurium precursor pulsing time may be even higher than 10 seconds. In some embodiments, pulsing times can be on the order of minutes. The optimum pulsing time can be readily determined by the skilled artisan based on the particular circumstances.

The concentration of the selenium or tellurium precursor in the reaction chamber may be from about 0.01% by volume to about 99.0% by volume. And the selenium or tellurium precursor may flow through the reaction chamber at a rate of between about 1 standard $cm^3$/min and about 4000 standard $cm^3$/min.

In some embodiments, the growth rate of the metal selenide or telluride material is between about 0.01 Å/cycle and about 2.0 Å/cycle. In some embodiments, the growth rate is between about 0.1 Å/cycle and about 1.0 Å/cycle. In some embodiments, the growth rate is about 0.2 Å/cycle.

The metal selenide or telluride ALD processes of the present disclosure comprise one or more cycles. Some embodiments involve the repetition of at least about 5 cycles, at least about 10 cycles, or at least about 50 cycles. In some embodiments, no more than 100 cycles are performed to form a thin film of a desirable thickness.

After a time period sufficient to completely react the previously adsorbed molecular layer with the selenium or tellurium precursor, for example the selenium or tellurium precursor pulse, any excess reactant and reaction byproducts are removed from the reaction space. As with the removal of the first reactant, this step may comprise stopping the flow of the selenium or tellurium precursor and continuing to flow a carrier gas, for a time period sufficient for excess reactive species and volatile reaction by-products to diffuse out of and be purged from the reaction space. In some embodiments a separate purge gas may be used. The purge may, in some embodiments, be from about 0.1 to about 10 s, about 0.1 to about 4 s or about 0.1 to about 0.5 s. Together, the selenium or tellurium precursor provision and removal represent a second phase in a metal selenide or telluride ALD cycle, and can also be considered a selenide or telluride phase.

The two phases together represent one ALD cycle, which is repeated to form metal selenide or telluride layers, such as magnesium selenide or magnesium telluride layers. While the ALD cycle is generally referred to herein as beginning with the metal phase, it is contemplated that in other embodiments the cycle may begin with the selenium or tellurium phase. As mentioned above, providing a selenium or tellurium precursor first may also serve to pretreat the substrate surface. Thus, in some embodiments, the substrate is subjected to a pretreatment where the pretreatment reactant is the same as the selenium or tellurium precursor.

The metal precursor employed in the ALD type processes may be solid, liquid, or gaseous material under standard conditions (room temperature and atmospheric pressure), provided that the metal precursor is in vapor phase before it is conducted into the reaction chamber and contacted with the substrate surface.

In some embodiments, the selenium or tellurium precursor includes selenium or tellurium plasma or selenium or tellurium radicals. In such embodiments, selenium or tellurium may be energized within the reaction chamber or upstream of the reaction chamber. Where a plasma is desired, the flow of un-energized selenium or tellurium precursor may comprise a type of purge gas, such that after the substrate has been exposed to a selenium or tellurium plasma for a desired period of time, the plasma generator may be turned off and the flow of selenium or tellurium precursor itself is used to clear the reaction chamber of excess selenium or tellurium plasma and unreacted byproducts.

While one skilled in the art will recognize that any number of suitable selenium or tellurium precursors may be used, appropriate selenium or tellurium precursors include selenium or tellurium containing compounds that favorably react with the ligands or a previously or subsequently deposited metal precursor. Accordingly, selection of an appropriate selenium or tellurium precursor may depend on the specific metal precursor used and the nature of the ligands in the metal precursor. In some embodiments, the metal precursor is $MgCp_2$, and the selenium or tellurium precursor is either a hydrogen selenide or telluride or an ammonium selenide or telluride.

Before starting the deposition of the film, the substrate is typically heated to a suitable growth temperature, as discussed above. The preferred deposition temperature may vary depending on a number of factors, such as, and without limitation, the reactant precursors, the pressure, flow rate, the arrangement of the reactor, and the composition of the substrate including the nature of the material to be deposited on.

Figure 4:
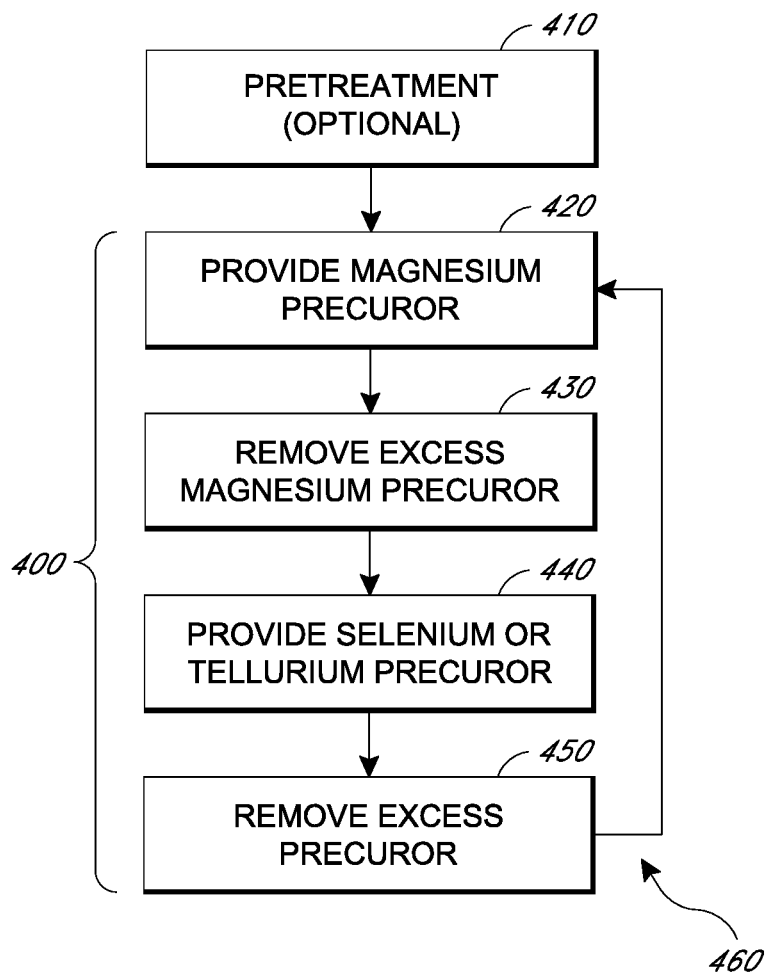
FIG. 4 is a flow chart illustrating an ALD process for forming a magnesium selenide or telluride thin film according to some embodiments.

FIG. 4 illustrates an example of an ALD process for forming a magnesium selenide or magnesium telluride thin film according to some embodiments of the present disclosure. A magnesium selenide or magnesium telluride ALD process comprises multiple steps that may occur in the order shown or may be rearranged as explained in further detail below. According to some embodiments, a magnesium selenide or magnesium telluride thin film is formed by an ALD-type process 400 comprising multiple pulsing cycles, each cycle comprising:

pulsing a vaporized first Mg precursor into the reaction chamber at step 420 to form at most a molecular monolayer of the Mg precursor on the substrate, purging the reaction chamber at step 430 to remove excess Mg precursor and reaction by products, if any, providing a pulse of a second Se or Te precursor onto the substrate at step 440, purging the reaction chamber at step 450 to remove excess second reactant and any gaseous by-products formed in the reaction between the Mg precursor layer on the first surface of the substrate and the second reactant, and repeating at step 460 the pulsing and purging steps until a magnesium selenide or magnesium telluride thin film of the desired thickness has been formed.

According to some embodiments, ALD process 400 may be preceded by a pretreatment of the substrate at step 410. In some embodiments, the pretreatment reactant may comprise selenium, or tellurium, and in some embodiments, the selenium-containing or tellurium-containing pretreatment reactant may be the same as the selenium, or tellurium precursor utilized in step 440, respectively.

According to some embodiments, the metal selenide or telluride film comprises at least some oxygen. Such oxygen may be present because at least one of the precursors contains oxygen or because of a compound used with the precursor contains oxygen, such as $H_2O$ in an aqueous solution of ammonium selenide or telluride. However, in some embodiments, the presence of oxygen is undesirable. Hence, the amount of oxygen in the thin film will be kept to a minimum or will not be present in any appreciable amount. And, in some embodiments, precursors having no or essentially no oxygen are utilized.

A capping layer may be desirable in some embodiments, for example because some metal selenide or telluride thin films are hygroscopic. Thus, according to some embodiments, a capping layer is deposited or formed on top of the metal selenide or telluride thin film. In some embodiments, a subsequently deposited or formed dielectric layer serves as a capping layer. In some embodiments the capping layer may protect the thin film during transport of the substrate. In some embodiments no capping layer is formed.

In some embodiments a capping layer may be a dielectric layer. In some embodiments a capping layer is not a dielectric layer and a subsequent dielectric layer is deposited over the capping layer where the dielectric layer comprises a different material than the capping layer. In some embodiments a capping layer may comprise a metal selenide or telluride or metal oxy-selenide or telluride having a different metal from the one used in the previously deposited metal selenide or telluride film.

In some embodiments, the metal selenide or telluride thin film is subjected to a post deposition treatment process. In some embodiments, the post treatment process is used subsequent to forming a dielectric layer above an interface layer. In some embodiments, the post treatment process is used subsequent to forming a metal layer above a dielectric layer However, in some embodiments; a pretreatment is carried out prior to any subsequent deposition, such as the deposition of a capping layer. In some embodiments, a post deposition treatment process includes, for example, at least one of an annealing process, a forming gas annealing process, and a selenium or tellurium passivation process. A selenium or tellurium passivation process may remove at least some unbound or undesirable carbon that may be present in the metal selenide or telluride thin film or the capping layer (e.g., the dielectric layer) on top of the metal selenide or telluride thin film. A hydrogen selenide or telluride may be used in a suitable selenium or tellurium passivation process as described in greater detail below.

Metal Precursors

It will be understood by one skilled in the art that the metal of the metal selenide or telluride thin films of the present disclosure may be selected from any number of options. In some embodiments, the metal precursor is selected from compounds containing Mg, Ca, Ba, and Sr. In some embodiments, the metal precursor comprises one or more ligands, such as cyclopentadienyl ("Cp") ligands. $MgCp_2$ is one example of a suitable metal precursor. In some embodiments, the metal precursor is a metal beta-diketonate. In some embodiments, the metal precursor is not a cyclopentadienyl-compound of Ba or Sr.

In some embodiments, the metal precursor has the following formula:

$$ML_2A_x \quad (I)$$

wherein each L can be independently selected to be a hydrocarbon group and M can be is Mg, Ca, Ba or Sr and A can be neutral ligand or adduct, such as ethylenediamine or EtOH, and x can be from 0 to 2. Preferably L can be linear, branched, cyclic alkyl or unsaturated hydrocarbon group, such as alkenyl, alkynyl, aromatic, cyclopentadienyl, phenyl, cyclooctadienyl, or cycloheptatrienyl group. Preferably M is Mg, Ba, Sr, or Ca. Preferably x is 0. More preferably L is cyclopentadienyl group. In some embodiments, the L can be a bidentate ligand, such as betadiketonate, guanidinate or amidinate. In some embodiments, the betadiketonate ligand can be acetylacetonate or 2,2,6,6-tetramethyl-3,5-heptanedionato (thd).

In some embodiments, the metal precursor is a cyclopentadienyl compound or derivated thereof, such as alkylsubstituted cyclopentadienyl compound and have the following formula:

$$M(R_1R_2R_3R_4R_5Cp)_2 \quad (II)$$

wherein each of the $R_1$-$R_5$ can be independently selected to be hydrogen or substituted or unsubstituted alkyl group and M can be Mg, Ca, Ba or Sr. In preferred embodiments each of the $R_1$-$R_5$ can be independently selected to be hydrogen or a linear or branched $C_1$-$C_5$ alkyl group. In more preferred embodiments each of the $R_1$-$R_5$ can be independently selected to be hydrogen or a $C_1$-$C_3$ alkyl group, such as methyl, ethyl, n-propyl or i-propyl group.

In some embodiments, the metal precursor comprises one or more ligands, such as cyclopentadienyl ("Cp") ligands. These source compounds can be selected from a group consisting of the following compounds:

$$(Cp)_xM \quad (III);$$

$$(Cp)_xL_yM \quad (IV);$$

$$(Cp)_xW_nM \quad (V);$$

$$(CP)_xL_yW_nM \quad (VI);$$

wherein M is Sc, Y, La, Ce, Pr, Nd, Sm, Eu, Gd, Tb, Dy, Ho, Er, Tm, Yb or Lu;

Cp is a cyclopentadienyl or a cyclooctadienyl group, so that Cp groups in chemical formulas I-IV can be the same with each other or different from one other; x denotes the number of the Cp ligands and it is an integer from 1 up to the oxidation state of M;

$L_y$ is a neutral adduct ligand that bounds from one or more of its atoms to the rare earth metal and where y denotes the number of the bound ligands; and W is some other ligand with a valence of −1 than Cp and where n denotes the number of the ligands. W is preferably beta-diketonate or its corresponding selenium or tellurium or nitrogen compound, halide, amide, alkokside, carboxylate or Schiff's base. It must be noted that cyclooctadiene is usually shortened as Cod, but here the presentation is simplified by the use of the single common abbreviation Cp for both cyclopentadienyl and cyclooctadienyl.

In the chemical equations I-IV, the cyclopentadienyl and/or cyclooctadienyl groups can be in the same molecule, so that there is a bridge between two Cp-groups consisting of a substituted or unsubstituted $C_1$-$C_6$ chain that may contain a heteroatom selected from Si, N, P, Se, Te, S or B.

L is preferably
(i) a hydrocarbon,
(ii) a hydrocarbon that contains oxygen,
(iii) a hydrocarbon that contains nitrogen,
(iv) a hydrocarbon that contains sulfur,
(v) a hydrocarbon that contains phosphorous,
(vi) a hydrocarbon that contains arsenic,
(vii) a hydrocarbon that contains selenium and/or
(viii) a hydrocarbon that contains tellurium L is more preferably
(a) amine or polyamine,
(b) bipyridine,
(c) a ligand according to a chemical equation

wherein G is —O—, —S—, or —NR$^1$, where R$^1$ is hydrogen or substituted or unsubstituted, cyclic, linear or branched, alkyl, alkenyl, aryl, alkylaryl, arylalkyl, alkoxy, thio, cyano or silyl group. A cyclic or aromatic ring in R$^1$ may contain a heteroatom. Hydrogen or R$^1$-type substituent may also be attached to the carbon atoms in chemical equation V, or (d) ether or thioether.

Cyclopentadienyl or cyclooctadienyl group Cp in chemical formulas I-IV has a form:

$$Cp'R_mH_{a-m} \quad (VII)$$

wherein m is an integer 0-8, when a is 8 and m is an integer 0-5 when a is 5,

Cp' is fusioned or isolated cyclopentadienyl or cyclooctadienyl and

R is a hydrocarbon fragment continuing 1-20 carbon atoms, preferably $C_1$-$C_6$ hydrocarbon.

R ligands can be the same with each other or different from one another. R can be a substituted or unsubstituted, cyclic, linear or branched, alkyl alkenyl, aryl, alkylaryl, arylalkyl, alkoxy, tbio, amino, cyano or silyl group. The cyclic or aromatic ring of the substituent may contain a hetero atom. Examples of the substituents are methyl, ethyl, propyl and isopropyl groups.

Neutral adduct ligands L shown in chemical equations II and IV can be ethers, amines or solvent molecules such as tetrahydrofurane that form a bond to the metal with one atom. Examples of suitable neutral adduct ligands that form a bond to a metal with several atoms are polyethers and polyamines.

In some embodiments, it is desirable to have the metal in the metal selenide or telluride thin film be the same as the metal in a dielectric layer that is to be deposited over the metal selenide or telluride layer. Thus, in some embodiments, a metal precursor is selected that has the same metal. In some embodiments the precursor may be the same precursor that is used in a subsequent process to deposit a dielectric layer, such as a metal oxide. In this vein, in some embodiments, the metal is selected from metal oxides that are desirable dielectric or high-k materials, such as MgO, SrTiO$_x$, CaTiO$_x$ and BaTiO$_x$.

Where a specific metal oxide is known to serve as a suitable or good dielectric material, the metal precursor used to form the metal oxide may be used in the presently disclosed methods to form a desirable metal selenide or telluride interfacial layer.

In some embodiments, the metal precursor does not comprise magnesium. However, magnesium may comprise a component of the metal precursor in other embodiments. In some embodiments, the metal precursor does not comprise strontium and/or barium. However, strontium and/or barium may comprise a component of the metal precursor in other embodiments. In some embodiments, the metal precursor does not comprise calcium. However, calcium may comprise a component of the metal precursor in other embodiments.

In some embodiments, the metal precursor is selected such that the metal of the metal precursor is distinct from any metal that may be present in the underlying substrate. For example, the metal precursor may be selected so as to provide a metal that is distinct from a metal in an underlying high-mobility channel. Thus, in some embodiments, the metal precursor specifically does not comprise Ga, As, In, Sb, etc. depending on the type of high-mobility channel or underlying substrate that is used. Similarly, in some embodiments, the metal precursor is selected such that the metal of the metal precursor is distinct from any metal that may be present in the high-k material or dielectric layer formed above the interfacial layer. However, in some embodiments, the metal of the metal precursor may also be found in one or both the underlying high-mobility channel and the overlying high-k material or dielectric layer.

According to some embodiments where the formation of a metal oxy-selenate or metal oxy-tellurate thin film is desired, suitable metal precursors can include, for example, compounds containing Mg, Al, In, Ga, Ge, and Gd.

Selenium or Tellurium Precursors

It will be understood by one skilled in the art that any number of selenium or tellurium precursors may be used. In some embodiments, the selenium or tellurium precursor is selected from the following list: H$_2$Se, H$_2$Te, (NH$_4$)$_2$S, (NH$_4$)$_2$Se, (NH$_4$)$_2$Te, dimethylselenide, dimethyltelluride, elemental or atomic Se, Te, other precursors containing selenium-hydrogen or tellurium-hydrogen bonds, such as H$_2$Se$_2$, H$_2$Te$_2$, or selenols or tellurols with the formula R—Se—H or R—Te—H, wherein R can be a substituted or unsubstituted hydrocarbon, preferably a $C_1$-$C_8$ alkyl group, more preferably a linear or branched $C_1$-$C_5$ alkyl group. Suitable selenium or tellurium precursors may include any number of selenium-containing or tellurium-containing compounds so long as they include at least one Se—H or Te—H bond. In some embodiments, the selenium or tellurium precursor may comprise a selenium or tellurium plasma or selenium or tellurium radicals. In some embodiments where energized selenium or tellurium is desired, a plasma may be generated in the reaction chamber or upstream of the reaction chamber.

In some embodiments where (NH$_4$)$_2$Se, or (NH$_4$)$_2$Te is employed, the ammonium selenide or telluride may be provided in an aqueous solution. In such embodiments, it may be desirable to provide the selenium or tellurium precursor in shorter pulses so as to reduce the effects that H$_2$O vapor from the solution may have on the substrate or film growth. However, in some embodiments, the selenium or tellurium precursor itself may comprise oxygen.

According to some embodiments, it is desirable to use an oxy-selenide or telluride—generically described as O$_x$—Se$_y$ or O$_x$—Se$_y$— or as oxy-selenate or oxy-tellurate—generically described as $O_x(Se-O_4)_{y+}$ or $O_x(Te-O_4)_y$. In some embodiments, an aqueous solution of $Se-O_x$ or $Te-O_x$ such as $SeO_4$, or $TeO_4$ may be used as the selenium or tellurium precursor.

Integration

The metal selenide or telluride thin films of the present disclosure may be used in a variety of semiconductor applications. For example, metal selenide or telluride films may be particularly useful in high-mobility channel applications, such as where III-V materials or germanium substrates are used. High-mobility channels are generally desirable in high-speed applications or high-switching applications. Metal selenide or telluride films may be used, for example, in FinFETs, planar transistors, MOSFETs, capacitors, vertical nanowires, and power transistors.

Additionally, metal selenide or telluride thin films according to the present disclosure may be used as the dielectric layer in a metal-insulator-semiconductor structure, such as in a MISFET.

Figure 5:
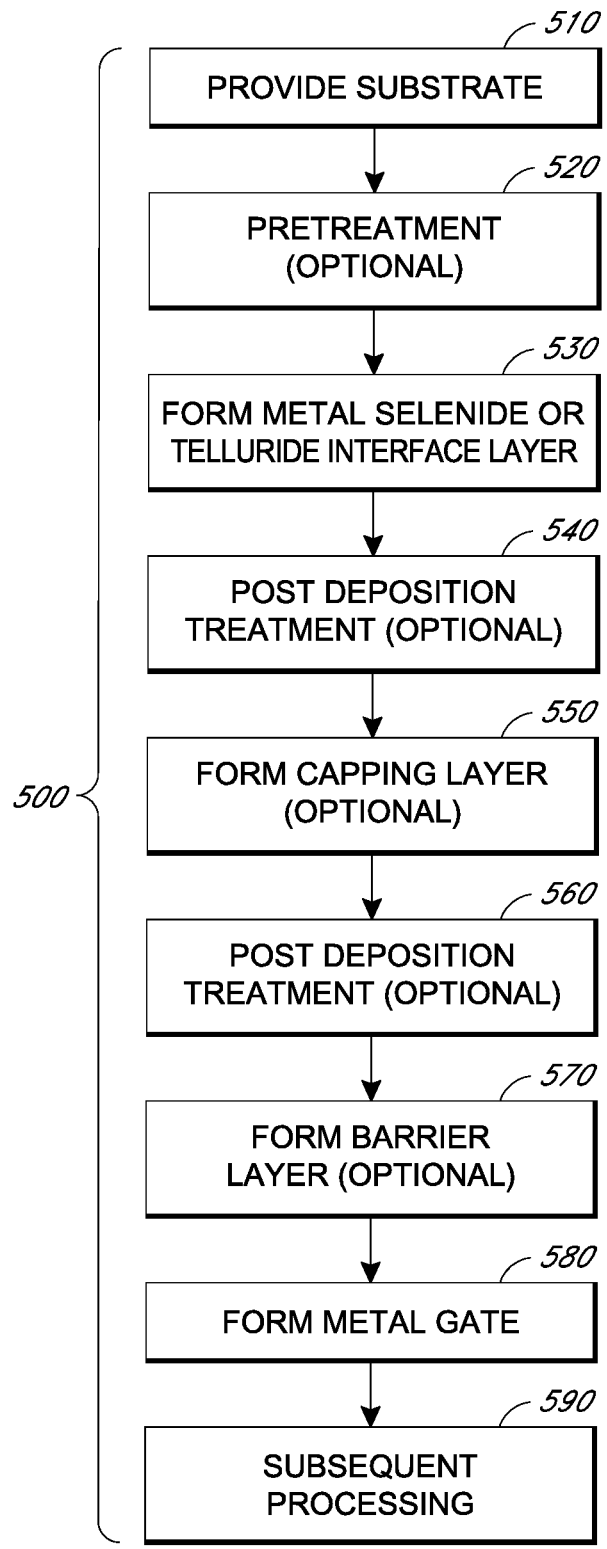
FIG. 5 illustrates an exemplary process for forming a three-dimensional architecture according to some embodiments of the present disclosure.

FIG. 5 illustrates an exemplary process flow 500 for the formation of a three-dimensional architecture, such as a gate stack, capacitor, etc. In some embodiments, the formation of a suitable semiconductor structure proceeds as follows:

A suitable substrate, such as one having a high-mobility channel (e.g., InGaAs), is provided at step 510;

The substrate is optionally subjected to a pretreatment process either ex situ or in situ at step 520;

A suitable metal selenide or telluride thin film is formed on a surface of the substrate, such as by an ALD process, at step 530;

An optional capping layer (e.g., a dielectric, such as a high-K dielectric like $Al_2O_3$ or $HfO_2$) is formed over the metal selenide or telluride thin film at step 550;

The substrate is optionally subjected to a post deposition treatment process, either before or after formation of the capping layer, at step 560;

Optionally, a barrier layer, such as TiN, is formed at step 570 over the capping layer by a process such as an ALD process;

A conductive layer, such as a metal gate, is then formed at step 580 on top of the previously formed layers; and Any further layers or materials as desired are formed on top of the conductive layer in subsequent processing steps at step 590.

According to some embodiments, the substrate surface provided at step 510 will include a high-mobility channel. Exemplary high-mobility channels include those composed of InGaAs and similar III-V materials, Si, Ge, and/or SiGe. The substrate surface may have been subject to prior processing before being provided for the metal selenide or telluride film integration process 400. For example the substrate may have been subjected to a doping process to form a source or a drain or both.

According to some embodiments, process 500 will be used to form a three-dimensional architecture, such as a transistor, a FinFET, vertical nanowire transistors, a planar transistor, a capacitor, a power transistor, etc.

A substrate is provided in step 500. In some embodiments the substrate is placed into a reaction space that is part of a deposition reactor, such as an ALD reactor, where the metal selenide or telluride interface film will be deposited. In some embodiments the substrate is provided to a tool for a pretreatment process 520 and subsequently provided to a deposition reactor.

FIG. 5 illustrates an optional pretreatment at step 520. A pretreatment may be used for any number of reasons including to clean the substrate surface, remove impurities, remove native oxide, and/or provide desirable surface terminations. In some embodiments, the pretreatment reactant comprises any suitable reducing chemistry. In some embodiments, a pretreatment comprises exposing the substrate surface to pretreatment reactant, which may comprise, for example, an ammonium selenide or telluride, a hydrogen selenide or telluride, HCl, or HF. The appropriate pretreatment reactant may be selected by the skilled artisan based on the particular circumstances and desired effect.

In some embodiments, such as where the substrate comprises a III-V material, HCl may be used as the pretreatment reactant. An HCl dip may remove the surface contaminants, such as hydrocarbons, particles and metals, but not fully remove the native oxide. HCl concentration may vary, but not limited, from to concentrated about 37 weight-% to dilute 1 weight-%.

In some embodiments, such as where a germanium substrate is used, HF may be used as the pretreatment reactant. HF dip may remove the surface contaminants, such as hydrocarbons, particles and metals, but not fully remove the native oxide. HCl concentration may vary, but not limited, from to concentrated about 50 weight-% to dilute 0.1 weight-%.

In some embodiments, a pretreatment process will utilize both HCl and HF. For example, a substrate surface may be exposed first to an HCl solution and then to an HF solution or vice versa. In some embodiments, the pretreatment process comprises a selenium or tellurium passivation process. In some embodiments the substrate is exposed to a pretreatment reactant comprising selenium or tellurium. The use of a pretreatment reactant comprising selenium or tellurium may provide—Se—H or Te—H terminations on the substrate surface. In such situations, the subsequent exposure to a metal precursor in the beginning of step 530, such as a magnesium precursor, will result in the immediate formation of metal-selenium or metal-tellurium bonds and the beginning of the metal selenide or telluride interface layer. In some embodiments, a pretreatment process may comprise the substrate surface being exposed to a hydrogen selenide or hydrogen telluride.

In some embodiments, surface terminations other than —Se—H or —Te—H terminations may be desired. In such instances, it may be desirable to use a non-selenium-containing non-tellurium-containing pretreatment reactant, such as the HF or HCl exposure described above. According to some embodiments, HCl and/or HF may be applied in-situ or in a clustered configuration.

Pretreatment 520 may comprise exposure to a liquid reactant, such as by submerging the substrate in a liquid bath or by exposing the substrate to a vapor phase pretreatment reactant. In some cases in-situ HCl or HF pretreatment from gas phase is done without airbreak or exposure to air. In some cases in-situ hydrogen selenide or telluride pretreatment from gas phase is done without airbreak or exposure to air.

In some embodiments, pretreatment may comprise changing the temperature and atmosphere, such as hydrogen plasma treatment, $NF_3$ plasma treatment, or thermal $H_2$ bake.

Subsequent to the pretreatment step, if performed, a metal selenide or telluride interface layer is formed 530. In some embodiments the metal selenide or telluride layer is formed directly over and contacting the surface of the substrate. In some embodiments the metal selenide or telluride layer is formed directly over and in contact with a high-mobility channel. In some embodiments, a suitable interface layer is one that comprises a metal selenide or telluride. Suitable metal selenide or telluride includes those where the metal is selected from the following: Mg, Ca, Ba, and Sr. In some embodiments, suitable metal selenide or tellurides includes those where the metal is not selected from the following: Al, Ga, or In. In some embodiments, it is desirable that the metal of the metal selenide or telluride film be distinct from the metal of either or both the underlying substrate surface and an overlying layer, such as a subsequently formed capping layer or dielectric layer. In some embodiments, the interface layer is deposited to be a distinct layer from the substrate meaning that no material from the substrate is consumed for the interface layer, except that some bonds may form between the substrate and the interface layer.

In some embodiments, the metal selenide or telluride thin film is deposited to achieve a particular thickness. Suitable thicknesses may be greater than or equal to about 1 Å and less than or equal to about 50 Å. In some embodiments, the thickness will be between about 5 Å and about 30 Å. In some embodiments, the thickness will be between about 5 Å and about 15 Å or 10 Å. In some embodiments, the thickness is between about 1 Å and about 5 Å. In to some embodiments, the suitable thickness will be one that achieves a complete layer over the substrate surface (i.e., one that leaves no gaps). Accordingly, the actual thickness that achieves a complete layer may depend on the type of metal selenide or telluride formed and the types of precursors used to achieve the metal selenide or telluride.

In some embodiments, suitable metal selenide or telluride materials include one or more of the following: beryllium selenide or telluride (BeSe, BeTe), magnesium selenide or telluride (MgSe, MgTe), calcium selenide or telluride (CaSe, CaTe), barium selenide or telluride (BaSe, BaTe), strontium selenide or telluride (SrSe, SrTe), yttrium selenide or telluride ($Y_2Se_{3+}$, $Y_2Te_3$), lead selenide or telluride (PbSe, PbTe), indium selenide or telluride ($In_2Se_3$, $In_2Se_3$), gallium selenide or telluride ($Ga_2Se_3$, $Ga_2Te_3$), aluminum selenide or telluride ($Al_2Se_3$, $Al_2Te_3$), silicon selenide or telluride ($SiSe_2$, $SiTe_2$), zinc selenide or telluride (ZnSe, ZnTe), cadmium selenide or telluride (CdSe, CdTe), germanium selenide or telluride ($GeSe_2$, $GeTe_2$), tantalum selenide or telluride ($TaSe_2$, $TaTe_2$), molybdenum selenide or telluride ($MoSe_2$, $MoTe_2$), lanthanum selenide or telluride (LaSe, LaTe) and other selenide or telluride of lanthanides (such as gadolinium selenide or telluride ($Gd_2Se_3$, $Gd_2Te_3$)), tungsten selenide or telluride ($WSe_2$, $WTe_2$), hafnium selenide or telluride ($HfSe_x$, $HfTe_x$), zirconium selenide or telluride ($ZrSe_x$, $ZrTe_x$), titanium selenide or telluride ($TiSe_x$, $TiTe_x$), and mixtures thereof. Other metal selenides or tellurides are also possible. For simplicity, these metal selenides or tellurides have been indicated to have these general stoichiometries. But it will be understood that the exact stoichiometry of any given metal selenide or telluride will vary based on the oxidation state of the metal. Accordingly, other stoichiometries are expressly contemplated.

In some embodiments the metal selenide or telluride interface layer comprises $Al_2Se$, $SiSe_2$, ZnSe, CdSe, SrSe, CaSe, BaSe, PbSe, $In_2Se_3$, $Ga_2Se_3$, $GeSe_2$, $Gd_2Se_3$, $TaSe_2$, $MoSe_2$, $WSe_2$, $Al_2Te$, $SiTe_2$, ZnTe, CdTe, SrTe, CaTe, BaTe, PbTe, $In_2Te_3$, $Ga_2Te_3$, $GeTe_2$, $Gd_2Te_3$, $TaTe_2$, $MoTe_2$ or $WTe_2$. In some embodiments the metal selenide or telluride interface layer is a $MgSe_x$, or $MgTe_x$ layer. In some embodiments, the metal selenide or telluride further comprises oxygen and/or nitrogen as well as optionally additional metals, such as in MgHfOSe, MgHfSe, MgSiSe, AlMgSe, MgSeO, MgSeN, MgHfOTe, MgHfTe, MgSiTe, AlMgTe, MgTeO, and MgTeN.

In some embodiments, the deposited metal selenide or telluride interface comprises at least about 5 at-% of selenium or tellurium, preferably more than about 15 at-% of selenium or tellurium and more preferably more than about 30 at-% of selenium or tellurium and most preferably more than about 40 at-% of selenium or tellurium. Depending on the metal oxidation state the metal selenide or telluride interface may comprise selenium or tellurium from about 45 at-% to about 75 at-%.

In some embodiments, a metal selenide or telluride interlayer is formed by an ALD process as described above. In some embodiments, the metal selenide or telluride is formed by a CVD process. CVD-like processes or a combination of ALD and CVD processes may also be used. In some embodiments, other processes, such as PVD, PEALD, etc. may be used.

In some embodiments the metal selenide or telluride interface layer can be subjected to a post-deposition treatment 540 prior to formation of a capping layer 550. For example, once a desired thickness of the metal selenide or telluride layer 530 is achieved, a selenium or tellurium passivation process (or other suitable post deposition treatment, such as an annealing process or a forming gas annealing process) may be carried out, after which a capping layer may be formed over the treated interface layer.

Subsequent to any post deposition treatment processing, an optional capping layer may be formed over the metal selenide or telluride interface layer. A capping layer may be desirable in some embodiments, for example because some metal selenide or telluride thin films are hygroscopic. Thus, according to some embodiments, a capping layer is deposited or formed on top of the metal selenide or telluride thin film. In some embodiments, a subsequently deposited or formed dielectric layer serves as a capping layer. In some embodiments the capping layer may protect the thin film during transport of the substrate. In some embodiments the capping layer may serve to protect a metal selenide or telluride thin film during transport of the substrate. In some embodiments the capping layer may function as a dielectric in a three-dimensional architecture, such as a gate stack, capacitor, etc.

In some embodiments the optional capping layer 550 may be a dielectric layer. In some embodiments the capping layer is deposited and a separate dielectric layer is deposited over the capping layer, where the dielectric layer comprises a different material from the capping layer. For example, in some embodiments, a capping layer comprising a metal selenide or telluride or metal oxy-selenide or telluride having a different metal from the one used in interface layer 530 is deposited over interface layer 530 prior to depositing a dielectric or high-k material.

The capping layer optionally formed at step 550 may comprise a dielectric layer. Generally, the dielectric layer includes a high-k material, such as aluminum oxide, tantalum oxide, hafnium oxide, or titanium oxide. In some embodiments, the capping layer may comprise a non-high-k material. As with the interface layer, the capping layer may be formed by ALD processes, CVD process, etc. The capping layer may have a thickness of from about 5 Å to about 200 Å, preferably from about 7 Å to about 100 Å, more preferably from about 10 Å to about 80 Å. The specific material and thickness can be selected by the skilled artisan based on the particular circumstances, including the specific type of structure being formed. In some embodiments, if the device has to have a high breakdown voltage, like in the case of power devices, the dielectric capping layer may have a thickness up to 100 nm to achieve desired properties.

A post-deposition treatment step 560 may be performed after the formation of the capping layer at step 550. In some embodiments, the post deposition treatment may precede the formation of a capping layer. In some embodiments where the capping layer is not a dielectric layer, a post deposition treatment may be applied after the formation of the capping layer but before the formation of a dielectric layer. In other embodiments the post deposition treatment step may be carried out after formation of a dielectric layer.

Similar to the pretreatment optionally applied at step 520, the post deposition treatment may involve the exposing the previously formed layers to specific conditions and/or reactants in order to improve the properties of the deposited films. For example, a post deposition treatment step may serve to remove unreacted reactants or reaction by-products, and/or to remove undesirable impurities from the deposited layer or layers. The post deposition treatment step may also change the physical properties of the deposited layers. In some embodiments, a post deposition treatment process may include, for example, an annealing process, for example annealing in a forming gas atmosphere, or a passivation process. The passivation may remove at least some unbound or undesirable carbon that may be present in the metal selenide or telluride thin film or the capping layer (e.g., the dielectric layer) on top of the metal selenide or telluride thin film.

A suitable post deposition treatment may involve an anneal in a specific atmosphere performed at temperatures from about 300° C. to about 800° C., pressures from about 0.1 Torr to about 760 Torr, and a forming gas $N_2/H_2$ or $N_2$ atmosphere. According to some embodiments, the use of a post deposition process may incorporate additional elements in the deposited materials. For example, in some embodiments, the use of a post deposition treatment involving a nitrogen precursor may result in the incorporation of nitrogen into the either or both the metal selenide or telluride thin film and the capping layer. Similarly the use of a post deposition process involving oxygen may result in the incorporation of at least some oxygen into the metal selenide or telluride thin film.

Following any post deposition treatment, an optional barrier layer may be formed 570. Suitable materials for a barrier layer may include elemental metal, metal nitrides, silicon-doped metal nitrides, metal boron carbides, metal aluminum carbides, metal aluminum silicon carbides, metal boron silicon carbides, carbides, and carbonitrides of various metals, such as titanium, tantalum, etc., and mixtures thereof. Suitable examples include SiN, TaCN, TiSiN, and TaSiN. In the case of metal carbides, suitable metals include Ti, Zr, Hf, V, Nb, Ta, Cr, Mo, and W with Ti or Ta being the most preferable options in some embodiments. In some embodiments the barrier layer might also be an oxide, such as $Al_2O_3$, MgO or $La_2O_3$, which can help in tuning the properties of the device, such as the effective work function of the conductive layer in the device. As with the previous layers, the barrier layer may be formed by ALD processes, CVD process, etc.

At step 580, a conductive layer is formed. In some embodiments the conductive layer is a gate. In some embodiments the conductive layer is a metal gate. The conductive layer may be formed by any process known in the art, such as by an ALD process, a CVD process, etc. The conductive layer may comprise any number of materials, such as TiN, TiC, TiAlC, TaC, TaAlC, NbAlC, TiAl, Al, TaAl, Ta, TaN, TaCN, W, WN, TiWN, and Co. In some embodiments, suitable metals for use in the conductive layer materials include Ti, Zr, Hf, V, Nb, Ta, Cr, Mo, and W and nitrides, silicon-doped nitrides, boron carbides, aluminum carbides, aluminum silicon carbides, boron silicon carbides, carbides, and carbonitrides of those metals.

In some embodiments, a process such as the one outlined above, is performed in situ or in a cluster tool. In some embodiments, only the metal selenide or telluride formation and capping layer formation are performed in situ. In some cases, the presence of the capping layer allows for the substrate to be more easily transferred between tools.

Figure 6:
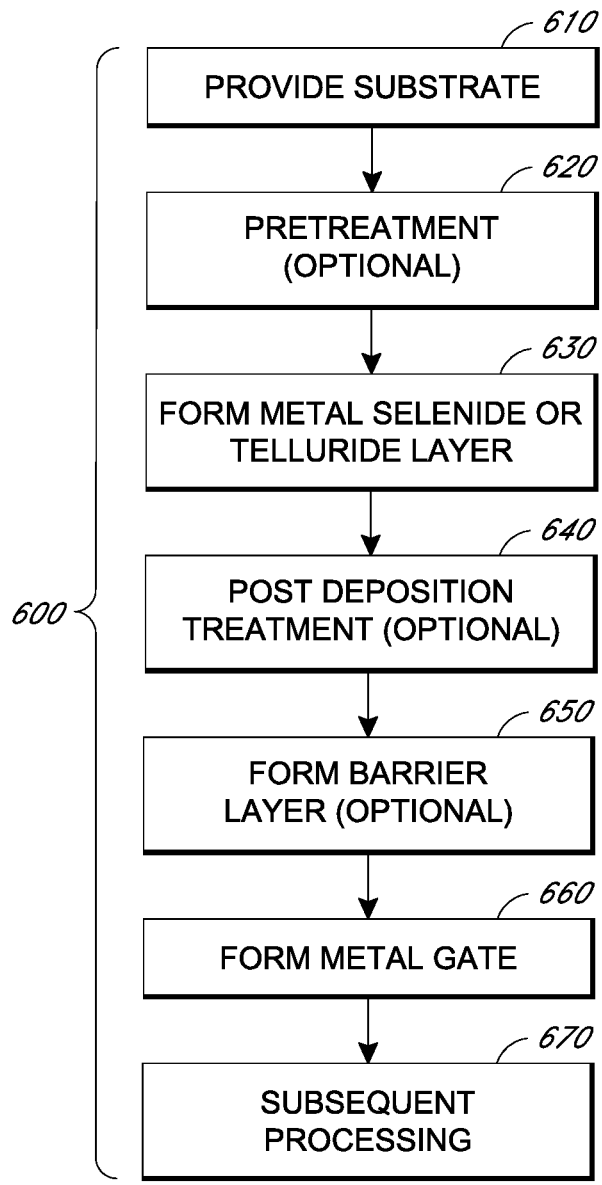
FIG. 6 illustrates another exemplary process for forming a three-dimensional architecture according to some embodiments of the present disclosure.

In some embodiments, subsequent processing may occur after the formation of the conductive layer. For example, additional layers may be formed or patterning of the deposited layers may occur. In some embodiments, the process is used to form a three dimensional structure, such as a fin in a FinFET device FIG. 6 illustrates an exemplary process flow 600 for the formation of a three-dimensional architecture comprising a substrate, a metal selenide or telluride layer, and an overlying conductive layer, such as a MIS gate stack, capacitor, etc. In some embodiments, the formation of a suitable semiconductor structure proceeds as follows:

A suitable substrate, such as one having a high-mobility channel (e.g., InGaAs), is provided at step 610;

The substrate is optionally subjected to a pretreatment process either ex situ or in situ at step 620;

A suitable metal selenide or telluride thin film is formed on a surface of the substrate, such as by an ALD process, at step 630;

The substrate is optionally subjected to a post deposition treatment process, at step 640;

Optionally, a barrier layer, such as TiN, is formed at step 650 over the metal selenide or telluride thin film by a process such as an ALD process;

A conductive layer, such as a metal gate, is then formed at step 660 on top of the previously formed layers; and Any further layers or materials as desired are formed on top of the conductive layer in subsequent processing steps at step 670.

According to some embodiments, the substrate surface provided at step 610 will include a high-mobility channel. Exemplary high-mobility channels include those composed of InGaAs and similar III-V materials. The substrate surface may have been subject to prior processing before being provided for the metal selenide or telluride film integration process 600. For example the substrate may have been subjected to a doping process to form a source or a drain or both.

According to some embodiments, process 600 will be used to form a three-dimensional MIS architecture, such as a MISFET. A substrate is provided in step 610. In some embodiments the substrate is placed into a reaction space that is part of a deposition reactor, such as an ALD reactor, where the metal selenide or telluride film will be deposited. In some embodiments the substrate is provided to a tool for a pretreatment process 620 and subsequently provided to a deposition reactor.

FIG. 6 illustrates an optional pretreatment at step 620. An optional pretreatment process 620 is substantially similar to optional pretreatment process 520 as described above in reference to FIG. 5.

Subsequent to the pretreatment step, if performed, a metal selenide or telluride dielectric layer is formed 630. In some embodiments a metal selenide or telluride layer is formed directly over and in contact with the surface of a substrate. In some embodiments a metal selenide or telluride layer is formed directly over and in contact with a high-mobility channel. In some embodiments, a suitable dielectric layer is one that comprises a metal selenide or telluride. Suitable metal selenide or telluride includes those where the metal is selected from the following: Mg, Ca, Ba, and Sr. In some embodiments, suitable metal selenide or telluride includes those where the metal is not selected from the following: Al, Ga, or In. In some embodiments, it is desirable that the metal of the metal selenide or telluride film be distinct from the metal of either or both the underlying substrate surface and an overlying layer, such as a subsequently formed conductive layer. In some embodiments, the dielectric layer is deposited to be a distinct layer from the substrate, meaning that no material from the substrate is consumed for the dielectric layer, except that some bonds may form between the substrate and the dielectric layer.

In some embodiments, the metal selenide or telluride thin film is deposited to achieve a particular thickness. Suitable thicknesses may be greater than or equal to about 1 Å and less than or equal to about 50 Å. In some embodiments, the thickness will be between about 5 Å and about 30 Å. In some embodiments, the thickness will be between about 5 Å and about 15 Å or 10 Å. In some embodiments, the thickness is between about 1 Å and about 5 Å. In to some embodiments, the suitable thickness will be one that achieves a complete layer over the substrate surface (i.e., one that leaves no gaps). Accordingly, the actual thickness that achieves a complete layer may depend on the type of metal selenide or telluride formed and the types of precursors used to achieve the metal selenide or telluride.

beryllium selenide or telluride (BeSe, BeTe), magnesium selenide or telluride (MgSe, MgTe), calcium selenide or telluride (CaSe, CaTe), barium selenide or telluride (BaSe, BaTe), strontium selenide or telluride (SrSe, SrTe), yttrium selenide or telluride ($Y_2Se_{3+}$, $Y_2Te_3$), lead selenide or telluride (PbSe, PbTe), indium selenide or telluride ($In_2Se_3$, $In_2Se_3$), gallium selenide or telluride ($Ga_2Se_3$, $Ga_2Te_3$), aluminum selenide or telluride ($Al_2Se_3$, $Al_2Te_3$), silicon selenide or telluride ($SiSe_2$, $SiTe_2$), zinc selenide or telluride (ZnSe, ZnTe), cadmium selenide or telluride (CdSe, CdTe), germanium selenide or telluride ($GeSe_2$, $GeTe_2$), tantalum selenide or telluride ($TaSe_2$, $TaTe_2$), molybdenum selenide or telluride ($MoSe_2$, $MoTe_2$), lanthanum selenide or telluride (LaSe, LaTe) and other selenide or telluride of lanthanides (such as gadolinium selenide or telluride ($Gd_2Se_3$, $Gd_2Te_3$)), tungsten selenide or telluride ($WSe_2$, $WTe_2$), hafnium selenide or telluride ($HfSe_x$, $HfTe_x$), zirconium selenide or telluride ($ZrSe_x$, $ZrTe_x$), titanium selenide or telluride ($TiSe_x$, $TiTe_x$), and mixtures thereof. Other metal selenides or tellurides are also possible. For simplicity, these metal selenides or tellurides have been indicated to have these general stoichiometries. But it will be understood that the exact stoichiometry of any given metal selenide or telluride will vary based on the oxidation state of the metal. Accordingly, other stoichiometries are expressly contemplated.

In some embodiments the metal selenide or telluride dielectric layer comprises $Al_2Se$, $SiSe_2$, ZnSe, CdSe, SrSe, CaSe, BaSe, PbSe, $In_2Se_3$, $Ga_2Se_3$, $GeSe_2$, $Gd_2Se_3$, $TaSe_2$, $MoSe_2$, $WSe_2$, $Al_2Te$, $SiTe_2$, ZnTe, CdTe, SrTe, CaTe, BaTe, PbTe, $In_2Te_3$, $Ga_2Te_3$, $GeTe_2$, $Gd_2Te_3$, $TaTe_2$, $MoTe_2$ or $WTe_2$. In some embodiments the metal selenide or telluride dielectric layer is a magnesium selenide or telluride layer. In some embodiments, the metal selenide or telluride further comprises oxygen and/or nitrogen as well as optionally additional metals, such as in MgHfOSe, MgHfSe, MgSiSe, AlMgSe, MgSeO, MgSeN, MgHfOTe, MgHfTe, MgSiTe, AlMgTe, MgTeO, and MgTeN.

In some embodiments, the deposited metal selenide or telluride dielectric layer comprises at least about 5 at-% of a selenide or telluride, preferably more than about 15 at-% of a selenide or telluride and more preferably more than about 30 at-% of a selenide or telluride and most preferably more than about 40 at-% of a selenide or telluride. Depending on the metal oxidation state the metal selenide or telluride dielectric may comprise a selenide or telluride from about 45 at-% to about 75 at-%.

In some embodiments, the metal selenide or telluride dielectric layer is formed by an ALD process as described above. In some embodiments, the metal selenide or telluride is formed by a CVD process. CVD-like processes or a combination of ALD and CVD processes may also be used. In some embodiments, other processes, such as PVD, PEALD, etc. may be used.

In some embodiments the metal selenide or telluride dielectric layer can be subjected to a post-deposition treatment 640. For example, once a desired thickness of the metal selenide or telluride layer 630 is achieved, a selenium or tellurium passivation process (or other suitable post deposition treatment, such as an annealing process or a forming gas annealing process) may be carried out.

Similar to the pretreatment optionally applied at step 620, the post deposition treatment may involve the exposing the previously formed layers to specific conditions and/or reactants in order to improve the properties of the deposited films. For example, a post deposition treatment step may serve to remove unreacted reactants or reaction by-products, and/or to remove undesirable impurities from the deposited layer or layers. The post deposition treatment step may also change the physical properties of the deposited layers. In some embodiments, a post deposition treatment process may include, for example, an annealing process, for example annealing in a forming gas atmosphere, or a passivation process. The passivation may remove at least some unbound or undesirable carbon that may be present in the metal selenide or telluride thin film. Suitable post deposition treatments are substantially similar to those described above with respect to step 560 in FIG. 5.

Following any post deposition treatment, an optional barrier layer may be formed 650. Suitable materials for a barrier layer may include elemental metal, metal nitrides, silicon-doped metal nitrides, metal boron carbides, metal aluminum carbides, metal aluminum silicon carbides, metal boron silicon carbides, carbides, and carbonitrides of various metals, such as titanium, tantalum, etc., and mixtures thereof. Suitable examples include SiN, TaCN, TiSiN, and TaSiN. In the case of metal carbides, suitable metals include Ti, Zr, Hf, V, Nb, Ta, Cr, Mo, and W with Ti or Ta being the most preferable options in some embodiments. In some embodiments the barrier layer might also be an oxide, such as $Al_2O_3$, MgO or $La_2O_3$, which can help in tuning the properties of the device, such as the effective work function of the conductive layer in the device. As with the previous layers, the barrier layer may be formed by ALD processes, CVD process, etc.

At step 660, a conductive layer, such as a metal gate, is formed. In some embodiments the conductive layer comprises a metal layer. In some embodiments the conductive layer comprises a metal gate. The conductive layer may be formed by any process known in the art, such as by an ALD process, a CVD process, etc. The conductive layer may comprise any number of materials, such as TiN, TiC, TiAlC, TaC, TaAlC, NbAlC, TiAl, Al, TaAl, Ta, TaN, TaCN, W, WN, TiWN, and Co. In some embodiments, suitable materials for use in the conductive layer include Ti, Zr, Hf, V, Nb, Ta, Cr, Mo, and W and nitrides, silicon-doped nitrides, boron carbides, aluminum carbides, aluminum silicon carbides, boron silicon carbides, carbides, and carbonitrides of those metals.

In some embodiments, a process such as the one outlined above, is performed in situ or in a cluster tool. In some embodiments, only the metal selenide or telluride formation and capping layer formation are performed in situ. In some cases, the presence of the capping layer allows for the substrate to be more easily transferred between tools.

In some embodiments, subsequent processing may occur after the formation of the conductive layer. For example, additional layers may be formed or patterning of the deposited layers may occur. In some embodiments, the process is used to form a three dimensional structure, such as a metal-insulator-semiconductor structure in a MISFET.

The terms "film" and "thin film" are used herein for simplicity. "Film" and "thin film" are meant to mean any continuous or non-continuous structures and material deposited by the methods disclosed herein. For example, "film" and "thin film" could include 2D materials, nanorods, nanotubes or nanoparticles or even single partial or full molecular layers or partial or full atomic layers or clusters of atoms and/or molecules. "Film" and "thin film" may comprise material or layer with pinholes, but still be at least partially continuous. Unless indicated otherwise, the phrase "metal selenide and telluride film" means metal selenide and metal telluride films.

Although the foregoing invention has been described in terms of certain preferred embodiments, other embodiments will be apparent to those of ordinary skill in the art. Additionally, other combinations, omissions, substitutions and modification will be apparent to the skilled artisan, in view of the disclosure herein. Accordingly, the present invention is not intended to be limited by the recitation of the preferred embodiments, but is instead to be defined by reference to the appended claims.

What is claimed is:

1. A method of forming a structure on a substrate surface, the method comprising:
   providing a substrate, comprising a high-mobility channel;
   forming a metal selenide or metal telluride thin film directly over the high-mobility channel using an atomic layer deposition (ALD) process comprising alternately and sequentially contacting the substrate with a first vapor-phase metal reactant and a second vapor-phase selenium or tellurium reactant;
   forming a conductive layer directly over the metal selenide or metal telluride thin film;
   wherein the metal of the metal selenide or metal telluride thin film comprises at least one of the following: magnesium, calcium, strontium, and barium.

2. The method of claim 1, wherein the structure comprises a three-dimensional architecture.

3. The method of claim 1, further comprising subjecting the substrate surface to a pretreatment process prior to forming a metal selenide or metal telluride thin film on the substrate.

4. The method of claim 1, further comprising forming a capping layer over the metal selenide or metal telluride thin film prior to forming the conductive layer.

5. The method of claim 4, wherein the capping layer comprises a dielectric material.

6. The method of claim 1, wherein forming a conductive layer over the metal selenide or metal telluride thin film comprises forming a conductive layer directly over the metal selenide or metal telluride thin film.

7. The method of claim 1, wherein the substrate surface comprises a metal or metals and the metal of the metal selenide or metal telluride thin film is different from the metal or metals of the underlying substrate surface.

8. The method of claim 4, wherein the capping layer comprises a metal or metals and the metal of the metal selenide or metal telluride thin film is different from the metal or metals of the subsequently formed capping layer.

9. The method of claim 4, wherein the capping layer comprises a metal or metals and the metal of the metal selenide or metal telluride thin film is the same as at least one of the metal or metals of the subsequently formed capping layer.

10. The method of claim 4, wherein the capping layer comprises a high-k dielectric material.

11. The method of claim 1, wherein the metal selenide or metal telluride thin film comprises at least one of the following metals: Be, Mg, Ca, Ba, Sr, Y, Sc, La, Ce, Pr, Nd, Pm, Sm, Eu, Gd, Tb, Dy, Ho, Er, Tm, Yb, Lu, Al, Si, Zn, Cd, Pb, In, Ga, Ge, Gd, Ta, Mo, and W.

12. The method of claim 1, wherein the metal selenide or metal telluride thin film comprises at least one of the following materials: MgSe, MgTe, CaSe, CaTe, SrSe, SrTe, BaSe, and BaTe.

13. The method of claim 1, wherein the metal selenide or metal telluride thin film has a thickness between about 0.1 nm and about 5 nm.

14. A method of forming a structure on a substrate surface, the method comprising:
   forming a metal selenide or metal telluride thin film directly on the substrate surface using an atomic layer deposition (ALD) process comprising alternately and sequentially contacting the substrate with a first vapor-phase metal reactant and a second vapor-phase selenium or tellurium reactant;
   forming a dielectric layer directly over the metal selenide or metal telluride thin film;
   wherein the metal of the metal selenide or metal telluride thin film comprises at least one of the following metals: Be, Mg, Ca, Ba, Sr, Y, Sc, La, Ce, Pr, Nd, Pm, Sm, Eu, Gd, Tb, Dy, Ho, Er, Tm, Yb, Lu, Al, Si, Zn, Cd, Pb, In, Ga, Ge, Gd, Ta, Mo, and W;
   wherein the substrate surface comprises a high-mobility channel.

15. The method of claim 14, further comprising forming a capping layer over the metal selenide or metal telluride thin film prior to forming the dielectric layer.

16. The method of claim 14, wherein the dielectric layer comprises a high-k dielectric material.

17. The method of claim 14, further comprising forming a conductive layer over the dielectric layer.

18. The method of claim 14, wherein the metal selenide or metal telluride thin film has a thickness between about 5 Å and about 20 Å.

19. The method of claim 14, wherein the metal selenide or metal telluride thin film comprises at least one of the following materials: MgSe, MgTe, CaSe, CaTe, SrSe, SrTe, BaSe, and BaTe.

20. A method of forming a gate stack on a substrate surface, the method comprising:
   depositing a metal selenide or metal telluride thin film directly on and covering a high-mobility channel on a substrate using an atomic layer deposition (ALD) process comprising alternately and sequentially contacting the substrate with a first vapor-phase metal reactant and a second vapor-phase selenium or tellurium reactant;

depositing a high-k dielectric layer directly over the metal selenide or metal telluride thin film;
wherein the metal of the metal selenide or metal telluride thin film comprises at least one of the following materials: MgSe, MgTe, CaSe, CaTe, SrSe, SrTe, BaSe, and BaTe.

21. The method of claim 20, further comprising depositing a gate electrode over the high-k dielectric layer.

22. The method of claim 20, wherein the metal selenide or metal telluride thin film is formed using a selenium or tellurium precursor selected from the following: elemental selenium, elemental tellurium, selenium plasma, tellurium plasma, $H_2Se$, and $H_2Te$.

23. The method of claim 20, wherein the metal of the metal selenide or metal telluride thin film comprises at least one of the following metals Be, Mg, Ca, Ba, Sr, Y, Sc, La, Ce, Pr, Nd, Pm, Sm, Eu, Gd, Tb, Dy, Ho, Er, Tm, Yb, Lu, Al, Si, Zn, Cd, Pb, In, Ga, Ge, Gd, Ta, Mo, and W.

* * * * *

UNITED STATES PATENT AND TRADEMARK OFFICE
CERTIFICATE OF CORRECTION

PATENT NO. : 9,741,815 B2
APPLICATION NO. : 14/741246
DATED : August 22, 2017
INVENTOR(S) : Qi Xie et al.

It is certified that error appears in the above-identified patent and that said Letters Patent is hereby corrected as shown below:

On the Title Page

In Column 2 (page 2, item (56)) at Line 37, Under Other Publications, change "vol." to --vols.--.

In Column 2 (page 2, item (56)) at Line 54, Under Other Publications, change "Physicas" to --Physics--.

In the Drawings

Sheet 3 of 6 (Reference Numeral 320, FIG. 3), Change "PRECUROR" to --PRECURSOR--.

Sheet 3 of 6 (Reference Numeral 330, FIG. 3), Change "PRECUROR" to --PRECURSOR--.

Sheet 3 of 6 (Reference Numeral 340, FIG. 3), Change "PRECUROR" to --PRECURSOR--.

Sheet 3 of 6 (Reference Numeral 350, FIG. 3), Change "PRECUROR" to --PRECURSOR--.

Sheet 3 of 6 (Reference Numeral 420, FIG. 4), Change "PRECUROR" to --PRECURSOR--.

Sheet 3 of 6 (Reference Numeral 430, FIG. 4), Change "PRECUROR" to --PRECURSOR--.

Sheet 3 of 6 (Reference Numeral 440, FIG. 4), Change "PRECUROR" to --PRECURSOR--.

Sheet 3 of 6 (Reference Numeral 450, FIG. 4), Change "PRECUROR" to --PRECURSOR--.

In the Specification

In Column 2 at Line 21, Change "magneiusm" to --magnesium--.

In Column 2 at Line 23, Change "magneiusm" to --magnesium--.

Signed and Sealed this
Nineteenth Day of December, 2017

Joseph Matal
*Performing the Functions and Duties of the*
*Under Secretary of Commerce for Intellectual Property and*
*Director of the United States Patent and Trademark Office*

CERTIFICATE OF CORRECTION (continued)
U.S. Pat. No. 9,741,815 B2

In Column 3 at Line 56, Change "metals" to --metals:--.

In Column 13 at Line 38, Change "and or" to --and/or--.

In Column 20 at Line 14, Change "unsatureated" to --unsaturated--.

In Column 20 at Lines 21-22, Change "-3, 5-" to -- -3,5- --.

In Column 20 at Line 63, Change "alkokside," to --alkoxide,--.

In Column 21 at Line 30, Change "heteroatoin." to --heteroatom.--.

In Column 21 at Line 47, Change "tbio," to --thio,--.

In Column 21 at Line 53, Change "tetrahydrofurane" to --tetrahydrofuran--.

In Column 23 at Line 1, Change "$O_x(Se-O_4)_{y+\ or}$" to --$O_x(Se-O_4)O_{y+}$ or--.

In the Claims

In Column 33 at Line 16, Claim 23, change "metals" to --metals:--.